(12) United States Patent
Fripp et al.

(10) Patent No.: US 7,199,480 B2
(45) Date of Patent: Apr. 3, 2007

(54) VIBRATION BASED POWER GENERATOR

(75) Inventors: Michael L. Fripp, Carrollton, TX (US); Robert K. Michael, Frisco, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 138 days.

(21) Appl. No.: 10/825,350

(22) Filed: Apr. 15, 2004

(65) Prior Publication Data

US 2005/0230973 A1 Oct. 20, 2005

(51) Int. Cl.
*H02K 35/00* (2006.01)

(52) U.S. Cl. ...................................... 290/1 R

(58) Field of Classification Search ...................... None
See application file for complete search history.

(56) References Cited

U.S. PATENT DOCUMENTS

| | | | |
|---|---|---|---|
| 2,895,063 A * | 7/1959 | Morris | 310/15 |
| 2,960,109 A | 11/1960 | Wilson | |
| 3,342,267 A | 9/1967 | Cotter et al. | |
| 3,398,302 A | 8/1968 | Hamau et al. | |
| 3,506,076 A * | 4/1970 | Angona | 175/57 |
| 3,558,936 A * | 1/1971 | Horan | 310/323.01 |
| 3,663,845 A * | 5/1972 | Apstein | 310/15 |
| 3,766,399 A | 10/1973 | Demetrescu | |
| 3,772,541 A * | 11/1973 | Campagnuolo et al. | 470/141 |
| 3,968,387 A | 7/1976 | Scarff | |
| 3,970,877 A * | 7/1976 | Russell et al. | 310/339 |
| 4,362,106 A * | 12/1982 | Campagnuolo et al. | 102/207 |
| 4,387,318 A | 6/1983 | Kolm et al. | |
| 4,467,236 A | 8/1984 | Kolm et al. | |
| 4,518,888 A * | 5/1985 | Zabcik | 310/334 |
| 4,536,674 A * | 8/1985 | Schmidt | 310/330 |
| 4,769,569 A | 9/1988 | Stahlhuth | |
| 4,808,874 A | 2/1989 | Stahlhuth | |
| 5,295,397 A | 3/1994 | Hall et al. | |
| 5,554,922 A | 9/1996 | Kunkel | |
| 5,626,200 A | 5/1997 | Gilbert et al. | |
| 5,703,474 A | 12/1997 | Smalser | |
| 5,801,475 A | 9/1998 | Kimura | |
| 5,839,508 A | 11/1998 | Tubel et al. | |
| 5,899,664 A * | 5/1999 | Lawrence | 416/83 |
| 5,907,211 A | 5/1999 | Hall et al. | |
| 6,011,346 A | 1/2000 | Buchanan et al. | |
| 6,020,653 A | 2/2000 | Woodbridge et al. | |

(Continued)

FOREIGN PATENT DOCUMENTS

GB 044822 10/1980

(Continued)

OTHER PUBLICATIONS

Office Action for U.S. Appl. No. 10/658,899 dated Sep. 14, 2005.

(Continued)

*Primary Examiner*—Joseph Waks
(74) *Attorney, Agent, or Firm*—Marlin R. Smith

(57) ABSTRACT

A vibration based power generator. In a described embodiment, an electrical power generating system includes a vibrating assembly which vibrates in response to fluid flow across the vibrating assembly. A generator generates electrical power in response to displacement of the vibrating assembly.

49 Claims, 14 Drawing Sheets

U.S. PATENT DOCUMENTS

| | | | |
|---|---|---|---|
| 6,217,284 B1* | 4/2001 | Lawrence | 416/83 |
| 6,424,079 B1 | 7/2002 | Carroll | |
| 6,504,258 B2 | 1/2003 | Schultz et al. | |
| 6,554,074 B2 | 4/2003 | Longbottom | |
| 6,607,030 B2 | 8/2003 | Bauer et al. | |
| 6,672,409 B1 | 1/2004 | Dock et al. | |
| 6,914,345 B2* | 7/2005 | Webster | 290/54 |
| 2002/0096887 A1 | 7/2002 | Schultz et al. | |
| 2006/0064972 A1* | 3/2006 | Allen | 60/369 |

FOREIGN PATENT DOCUMENTS

| | | |
|---|---|---|
| WO | WO 02/10553 | 2/2002 |
| WO | WO 02/057589 | 7/2002 |

OTHER PUBLICATIONS

U.K. Search Report for application No. GB 0419933.7.

"Extracting Energy From Natural Flow," NASA Tech. Briefs, Spring 1980, vol. 5, No. 1, MFS-23989.

Parkinson, Geoffrey, "Phenomena and Modelling of Flow-Induced Vibrations of Bluff Bodies", Progress In Aerospace Sciences, vol. 26, pp. 169-224, 1989.

"Characteristics of Relaxor-Based Piezoelectric Single Crystals for Ultrasonic Transducers," IEEE Transactions on Ultrasonics, Ferroelectrics, and Frequency Control, 44(5):1140-1147 (Sep. 1997).

Hall & Prechtl "Development of a Piezoelectric Servoflap for Helicopter Rotor Control," Smart Materials and Structures vol. 5 1996 pp. 26-34.

PI (Physik Instrumente), "NanoAutomation®, Piezo Technology NanoPositioning MicroPositioning Hexapods", dated 1996-2004.

PI, "Introduction to Piezo Actuators", dated 1996-2004.

"Closed-Loop, High Deflection PICMA® Multilayer Piezo Bender Actuators", undated.

"PICA-Stack Piezoceramic Actuators Versatile Piezoelectric Power", undated.

Blevins, Robert, "Flow induced vibration", Van Nostrand Reinhold Co., N.Y., 1977; Chapters 3 and 4.

Jaffe, B., Cook, W. R., Jr., Jaffe, H., "Piezoelectric ceramics", Marietta: R. A. N. Publishers, 1971; Chapters 1, 2, and 12.

Examination Report for UK application Ser. No. GB0419933.7.

Office Action dated Aug. 28, 2006 for U.S. Appl. No. 10/826,952.

* cited by examiner

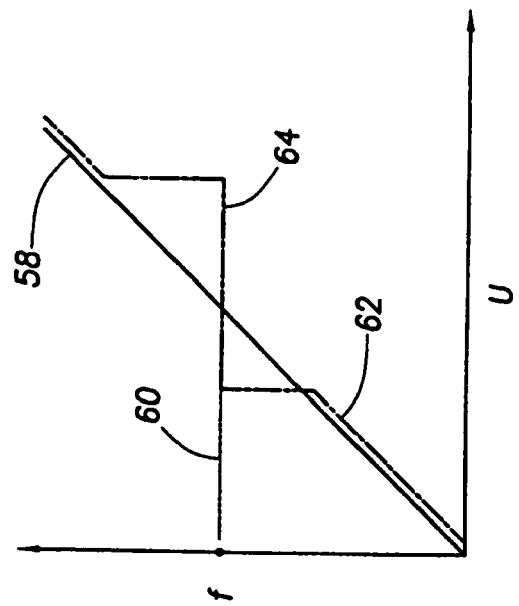
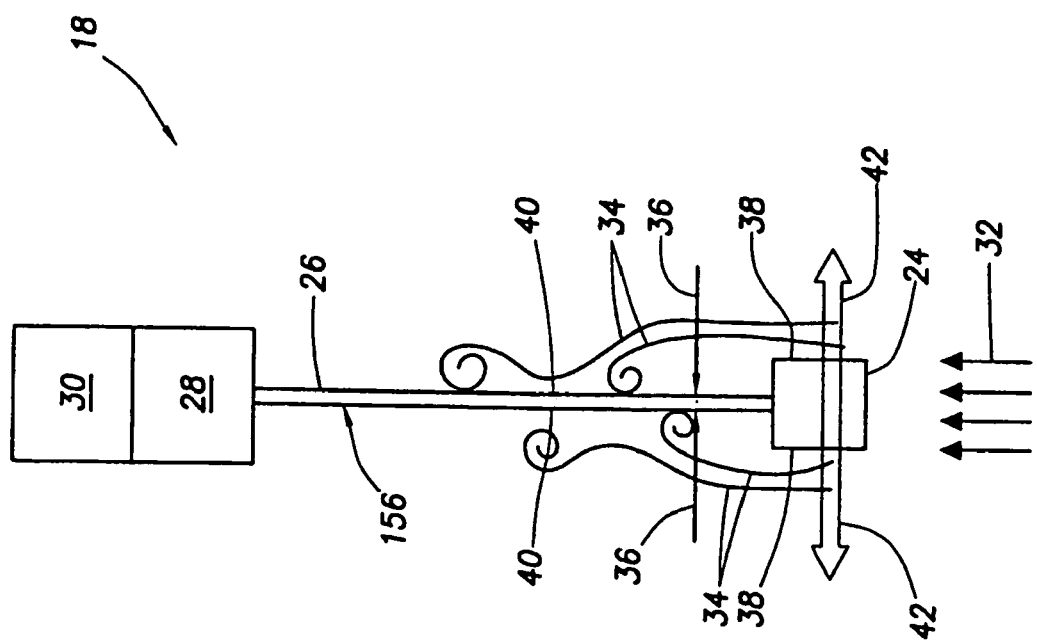

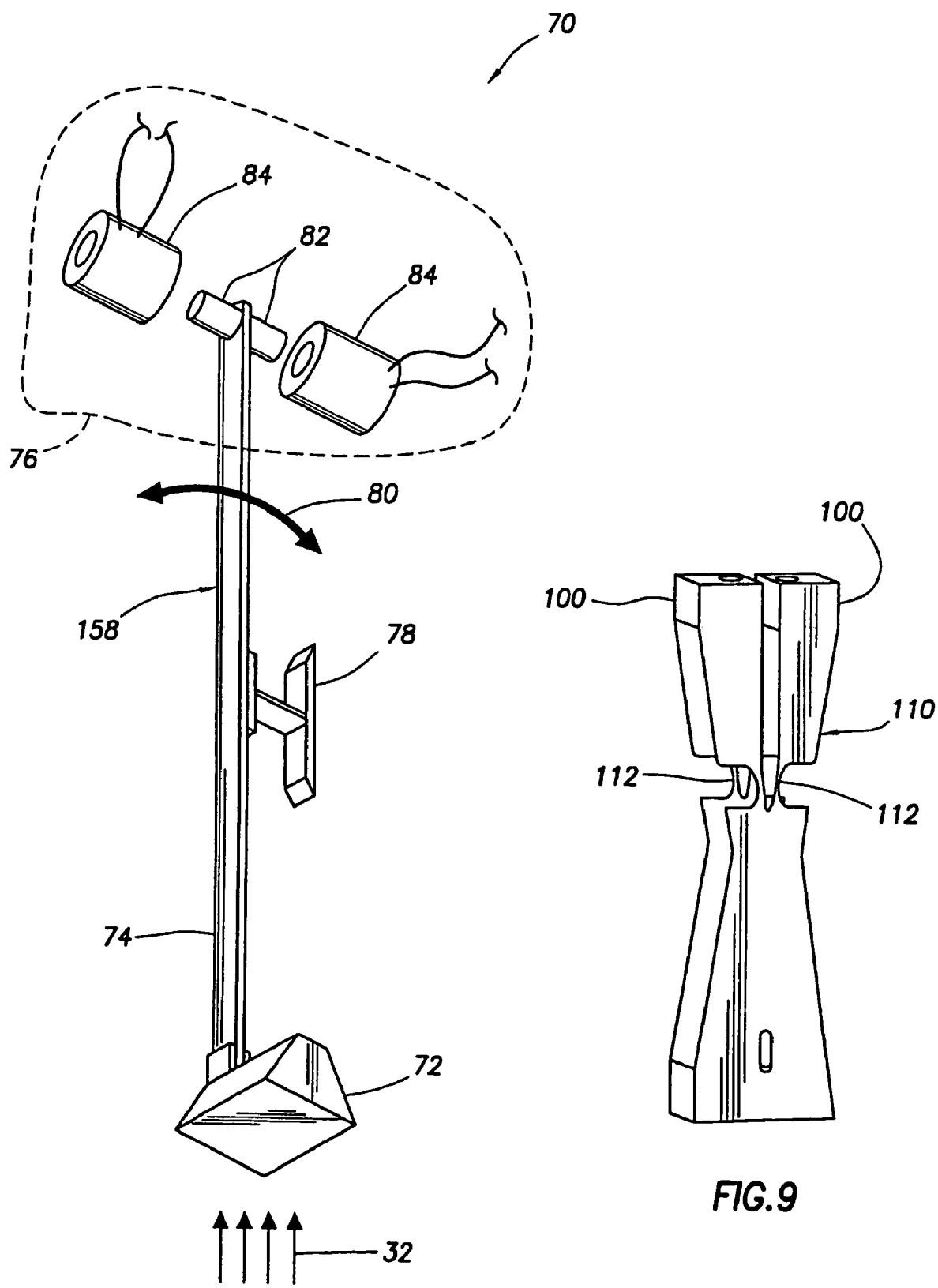

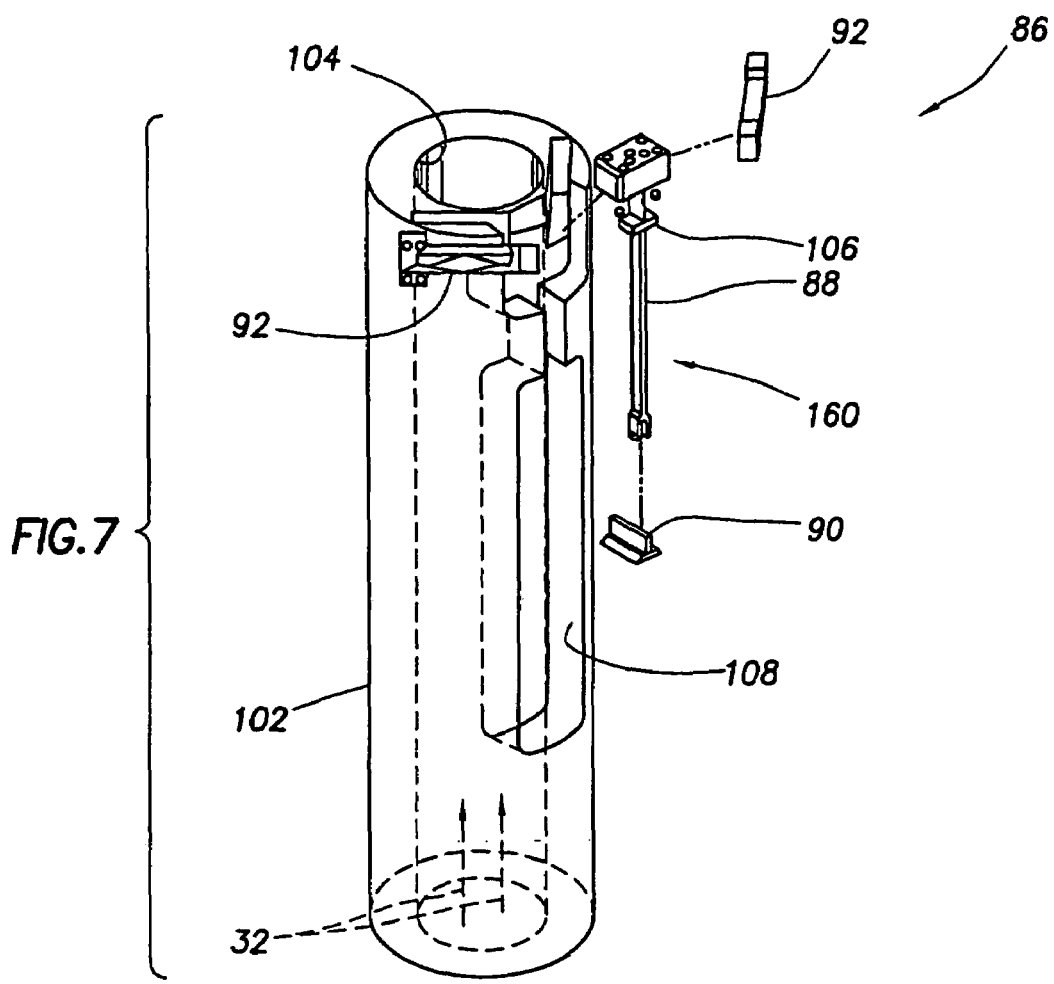
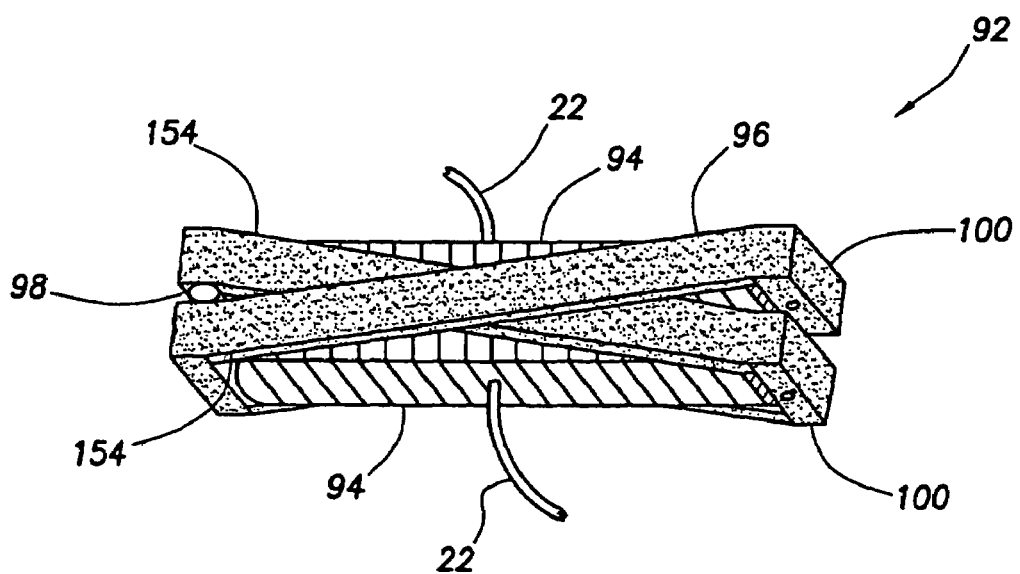
FIG.8

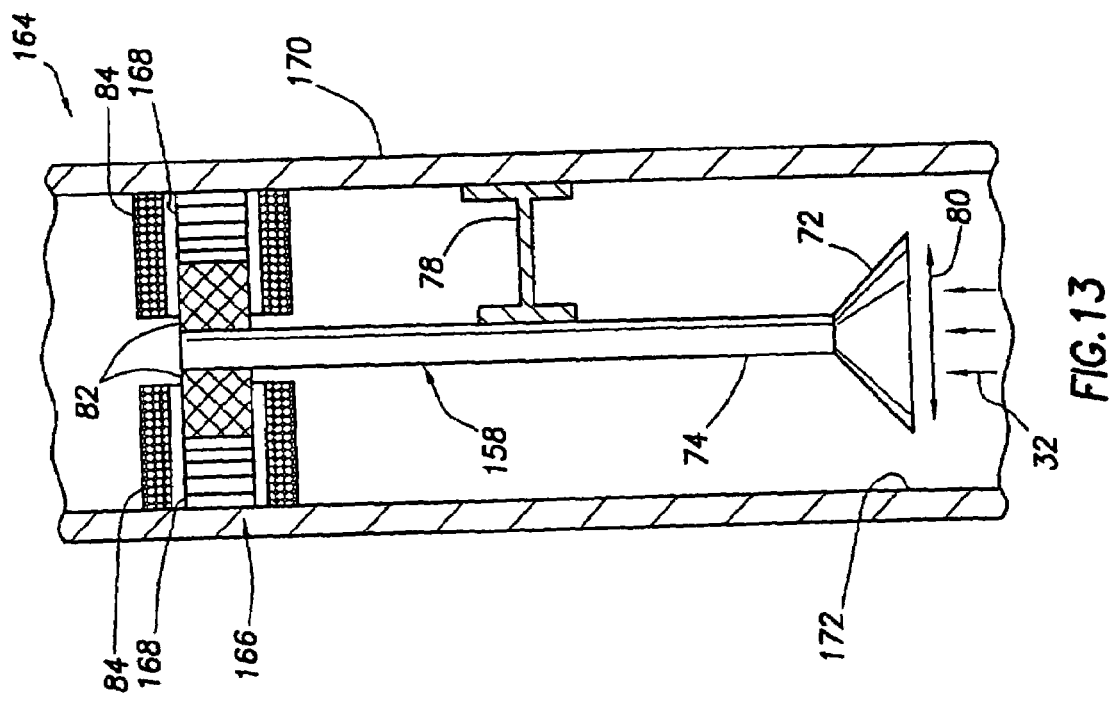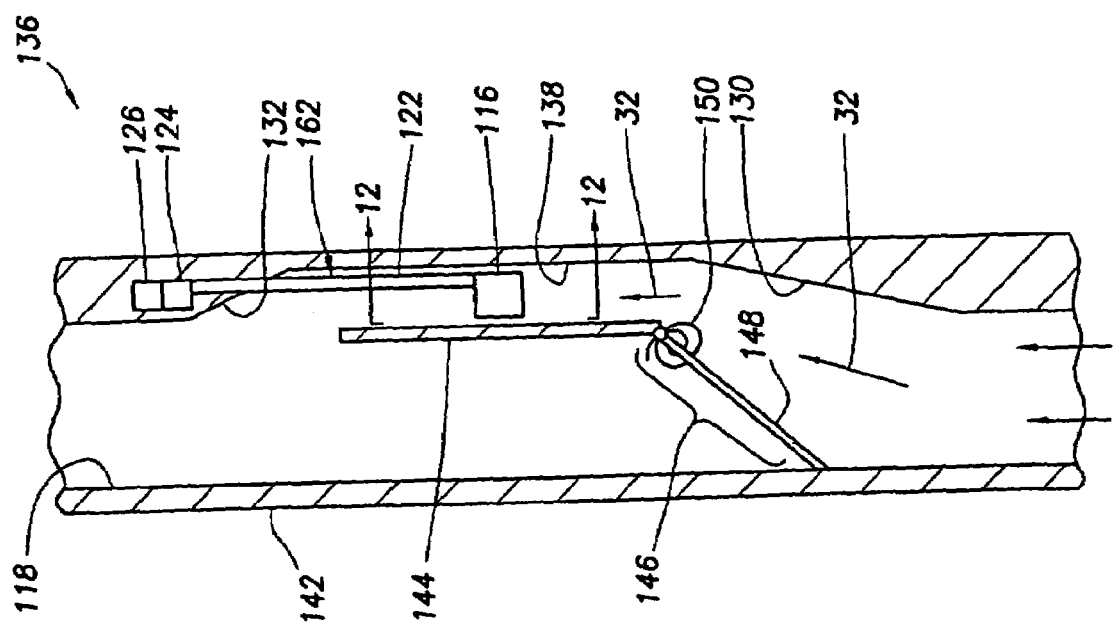

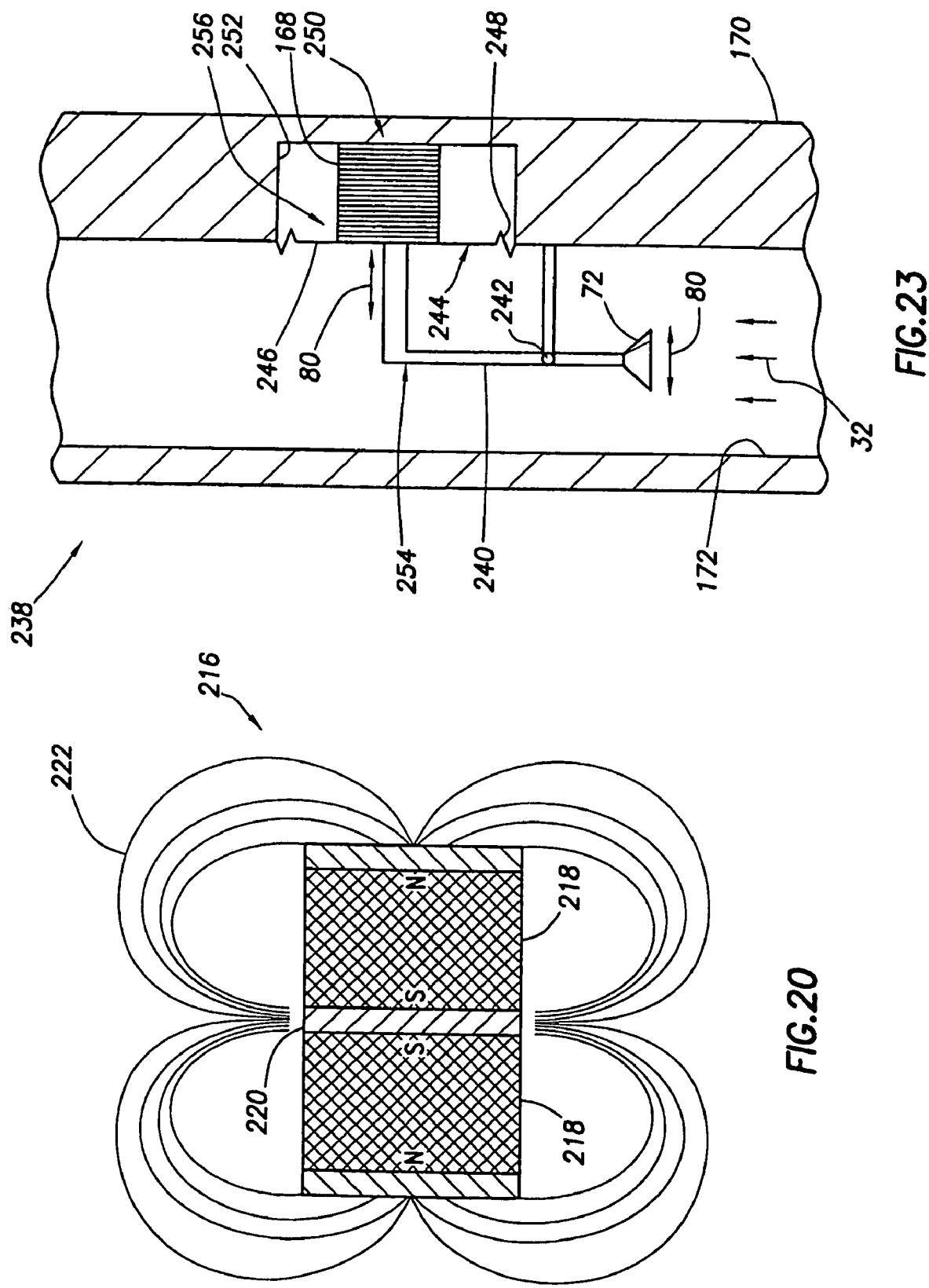

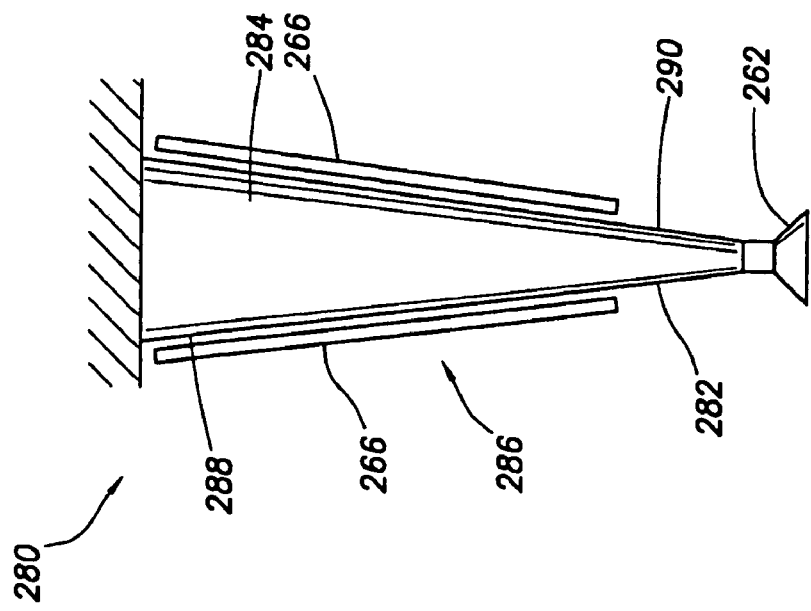
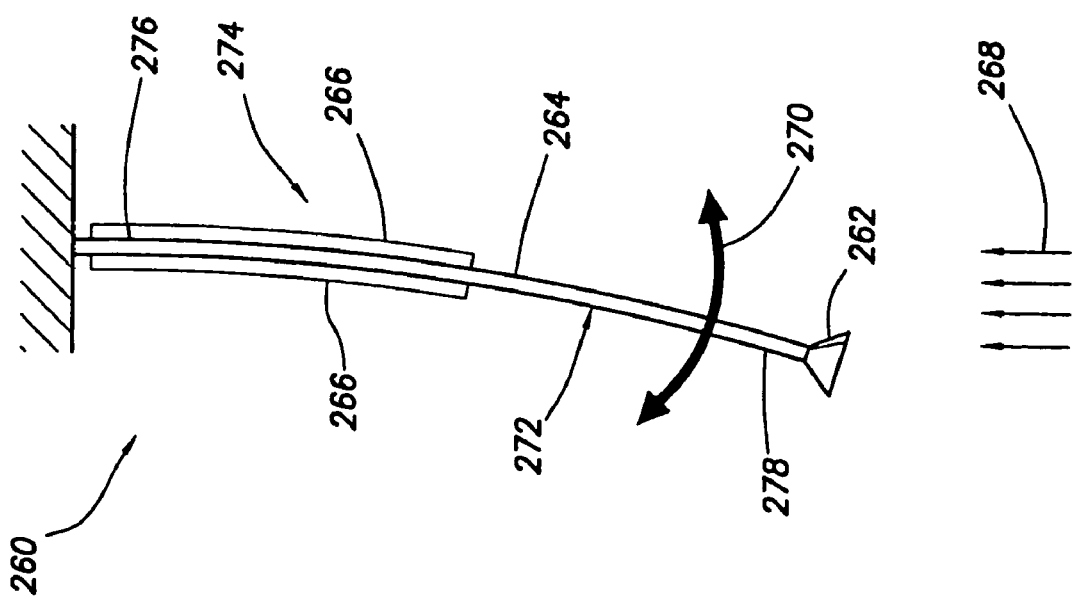

VIBRATION BASED POWER GENERATOR

CROSS-REFERENCE TO RELATED APPLICATION

The present application is related to copending application Ser. No. 10/826,952, the entire disclosure of which is incorporated herein by this reference.

BACKGROUND

The present invention relates generally to electrical power generation and, in an embodiment described herein, more particularly provides a vibration based power generator.

It is well known in the art to produce electrical power from vibration of a member or assembly due to fluid flow impinging on the member or assembly. However, past designs of such vibration based power generators have not achieved maximum efficiency in coupling the fluid flow to the vibrating member or assembly. Consequently, most prior vibration based power generators do not most effectively utilize energy available in the fluid flow for conversion to electricity.

Furthermore, some prior vibration based power generators unacceptably obstruct a passage through which the fluid flows. This creates a pressure drop in the passage and restricts access through the passage.

From the foregoing, it can be seen that it would be quite desirable to provide an improved vibration based power generator.

SUMMARY

In carrying out the principles of the present invention, in accordance with an embodiment thereof, an electrical power generating system is provided which efficiently converts fluid flow energy into electrical energy without substantially obstructing fluid flow or access through the system.

In one aspect of the invention, an electrical power generating system is provided which includes a vibrating assembly and a generator. The vibrating assembly displaces in response to fluid flow across the vibrating assembly. The generator generates electrical power in response to displacement of the vibrating assembly.

The vibrating assembly may include a lift reversal device which produces alternating lift coefficients in the vibrating assembly in response to the fluid flow across the vibrating assembly.

Displacement of the vibrating assembly may be transmitted to the generator across a membrane isolating at least a portion of the generator from the fluid flow.

The generator may include a magnet and coil. Relative displacement between the magnet and coil may produce electricity in the coil in response to displacement of the vibrating assembly. A passage may extend between opposite ends of the coil. The passage may be in fluid communication with the fluid flowing across the vibrating assembly at each opposite end of the coil. In an alternate embodiment, displacement of the vibrating assembly in response to the fluid flow may be initiated by applying an electric potential to the coil. In another alternate embodiment, relative rotation between the magnet and coil may be produced in response to displacement of the vibrating assembly.

The generator may include at least first and second magnets, and a coil. Relative displacement between the first magnet and the coil may be produced in response to displacement of the vibrating assembly. Magnetic fields produced by the first and second magnets may bias against relative displacement between the first and second magnets.

The generator may include a housing which is displaced in response to displacement of the vibrating assembly. The housing may contain a magnet and a coil. Relative displacement between the magnet and coil may produce electricity in the coil in response to displacement of the housing.

The generator may include a magnet which is displaced relative to a ferromagnetic core, thereby producing electricity in a coil in response to displacement of the vibrating assembly.

The generator may include an electromagnetically active material. Strain may be produced in the electromagnetically active material in response to displacement of the vibrating assembly.

These and other features, advantages, benefits and objects of the present invention will become apparent to one of ordinary skill in the art upon careful consideration of the detailed description of representative embodiments of the invention hereinbelow and the accompanying drawings.

BRIEF DESCRIPTION OF THE DRAWINGS

FIG. 3 is another side view of the system of FIG. 2, rotated 90 degrees about its longitudinal axis;

FIG. 5 is graph of vortex shedding frequency versus flow velocity in the system of FIGS. 2 & 3;

FIG. 6 is an isometric view of a second electrical power generating system embodying principles of the present invention;

FIG. 7 is an isometric view of a third electrical power generating system embodying principles of the present invention;

FIG. 8 is an isometric view of an elastic support and electrical power generator which may be used in the system of FIG. 7;

FIG. 9 is an isometric view of a lever device which may be used in the system of FIG. 7;

FIG. 11 is a partially cross-sectional view of a fifth electrical power generating system embodying principles of the present invention;

FIG. 13 is a partially cross-sectional view of a sixth electrical power generating system embodying principles of the present invention;

FIG. 20 is a schematic view of a magnet configuration which may be used in electrical power generating systems embodying principles of the present invention;

FIG. 23 is a partially cross-sectional view of a fourteenth electrical power generating system embodying principles of the present invention;

FIG. 24 is a schematic view of a fifteenth electrical power generating system embodying principles of the present invention;

FIG. 25 is a schematic view of a sixteenth electrical power generating system embodying principles of the present invention;

DETAILED DESCRIPTION

Figures 1, 2:
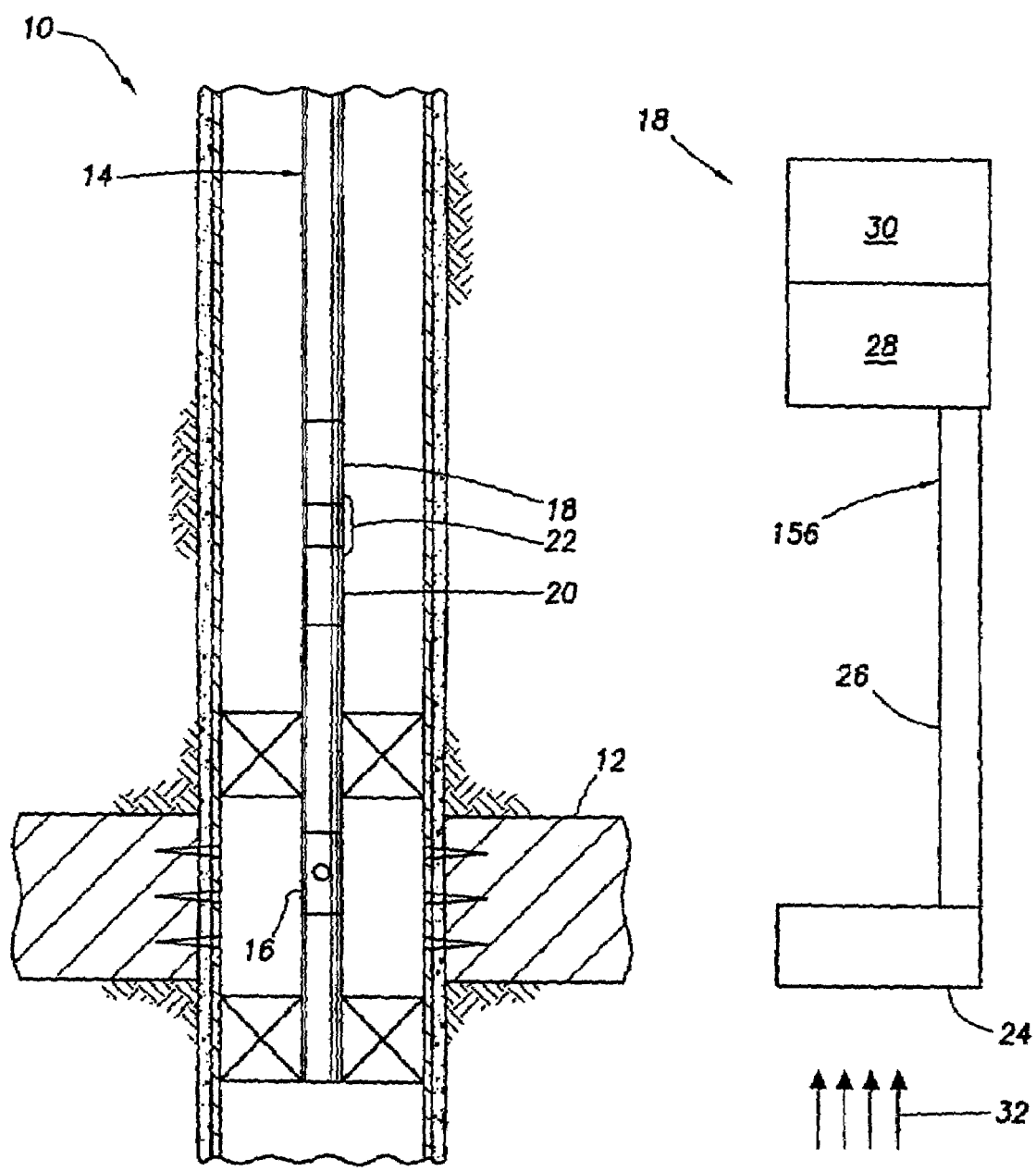
FIG. 1 is a schematic partially cross-sectional view of a well which includes an electrical power generating system embodying principles of the present invention.
FIG. 2 is side view of a first electrical power generating system embodying principles of the present invention which may be used in the well of FIG. 1.

Representatively illustrated in FIG. 1 is a configuration of a subterranean well 10 which embodies principles of the present invention. In the following description of the well 10 and other apparatus and methods described herein, directional terms, such as "above", "below", "upper", "lower", etc., are used only for convenience in referring to the accompanying drawings. Additionally, it is to be understood that the various embodiments of the present invention described herein may be utilized in various orientations, such as inclined, inverted, horizontal, vertical, etc., and in various configurations, without departing from the principles of the present invention.

The well 10 is described herein as being a producing well in which fluid is produced from a formation 12 into a tubular string 14, and is then flowed through the tubular string to the earth's surface. However, it is to be clearly understood that principles of the present invention may be incorporated into other types of wells and other systems, for example, where fluid is injected into a formation or circulated in the well (such as during drilling operations), where fluids pass from a relatively high pressure source to a relatively low pressure zone within the well, or where fluid flows from a pump or other "artificial" pressure source, etc. Thus, it is not necessary in keeping with the principles of the present invention for fluid to be produced through a tubular string or from a well.

In the well 10 as depicted in FIG. 1, fluid from the formation 12 enters the tubular string 14 through a valve 16 or other opening in the tubular string and flows upwardly in the tubular string. Interconnected in the tubular string 14 is an electrical power generating system 18 through which the fluid flows. In one important aspect of the present invention, this fluid flow through the system 18 causes it to generate electrical power. This electrical power may then be used to operate a downhole tool, such as a valve 20 interconnected in the tubular string 14. It is to be clearly understood that the valve 20 is used merely as an example of the wide variety of downhole tools and other types of devices that may be powered by the system 18, such as sensors, samplers, flow control devices, communication devices, etc.

Electric lines or conductors 22 may be used to electrically connect the system 18 to the valve 20, enabling the valve to be remotely located relative to the system. Alternatively, the system 18 and valve 20 (or other downhole tools or other devices) may be integrally formed or directly connected to each other. Furthermore, the system 18 may be positioned above or below the valve 20, or in any other position relative to the valve.

Referring additionally now to FIG. 2, internal components of the system 18 are representatively illustrated apart from the remainder of the system and the well 10. Specifically, a vibrating assembly 156 including a vortex shedding device 24 and an elongated beam or arm 26, an elastic support 28 and an electrical power generator 30 are schematically depicted in FIG. 2.

Fluid flow through the system 18 is represented by arrows 32. The fluid flow 32 impinges on the vortex shedding device 24, thereby causing electrical power to be generated by the generator 30. The fluid flow 32 may include one or more liquids (such as oil, water, etc.), one or more gases (such as natural gas, nitrogen, air, etc.), one or more solids (such as sand, mud, etc.) or any combination of liquid, gas and/or solid.

When the fluid flow 32 does not impinge on the device 24, the device and arm 26 are maintained in a neutral position by the elastic support 28. However, when the fluid flow 32 impinges on the device 24, the device sheds vortices 34 which produce alternating lift forces 36 on the device and the arm 26, causing the device and arm to vibrate. These vortices 34 and lift forces 36 are representatively illustrated in FIG. 3, which depicts a side view of the system 18 rotated 90 degrees from that shown in FIG. 2.

In FIG. 3 it may be seen that the vortices 34 shed by the device 24 impinge on lateral surface areas 38 of the device, and on lateral surface areas 40 of the arm 26. The lift forces 36 produced by the vortices 34 impinging on the surface areas 38, 40 cause the arm 26 and device 24 to displace laterally back and forth, as represented by arrows 42. Note, however, that vibrations and displacements other than laterally directed (such as rotational or axial displacements, etc.) could be used in keeping with the principles of the invention.

The frequency of this back and forth vibration or displacement 42 of the arm 26 and device 24 is determined in substantial part by the stiffness or rigidity of the elastic support 28, since displacement of the arm produces strain in the elastic support. Preferably, the arm 26 and device 38 are very rigid, so that only minimal strain is imparted to these elements by the lift forces 36 due to the shed vortices 34. However, the arm 26 and/or device 38 could be made more flexible if, for example, it is desired to modify a resonant frequency or amplitude at which the displacement 42 occurs, reduced stiffness in these elements is used to enhance the efficiency of the system 18, etc.

The vibrating displacement 42 of the arm 26 is converted into electricity by the generator 30. The generator 30 may be any type of device which is capable of converting the displacement 42 into electricity. Several embodiments of the generator 30 are described below, but it should be clearly understood that the principles of the invention are not limited to any particular embodiment or method of generating electricity described herein.

The frequency and amplitude of the vibrating displacement 42 are governed by several factors, including the mass, location and relative stiffness of each displacing element of the system 18. Preferably, the elastic support 28 is less rigid than the arm 26, so that the arm is not substantially flexed or bent along its length during the displacement 42. The elastic support 28 biases the arm 26 toward its neutral position when the lift forces 36 due to the vortices 34 displace the arm away from the neutral position. In general, the more rigid the elastic support 28, the greater the resonant frequency of the assembly 156.

The vortices 34 are shed and impinge on the device 24 and arm 26 at a frequency which is dependent in substantial part on the velocity of the fluid flow 32. In general, as the velocity of the fluid flow 32 increases, the frequency of the vortices 34 also increases. As explained in more detail below, the frequency at which the vortices 34 are shed is preferably substantially equal to the resonant frequency of the assembly 156, so that the lift forces 36 produced by the vortices enhance the amplitude of the displacement 42, thereby increasing the level of electrical power produced by the generator 30.

Referring additionally now to FIGS. 4A–D, several different alternate configurations 44, 46, 48, 50 of the vortex shedding device 24 are representatively illustrated. It should be clearly understood that the vortex shedding device 24 is not limited to these configurations 44, 46, 48, 50. Instead, any configuration of the vortex shedding device 24 may be used in keeping with the principles of the invention.

Each of the configurations 44, 46, 48, 50 presents a substantially flat planar face 52 to the fluid flow 32. Accordingly, such vortex shedding devices may be known to those skilled in the art as "bluff" bodies. Alternatively, the face 52 could be rounded, concave, convex, or otherwise shaped, without departing from the principles of the invention.

The vortices 34 are shed as the fluid flow 32 spills over the edges of the face 52. The configurations 44, 46, 48, 50 differ most substantially in how they are shaped downstream of the face 52, which influences the frequency at which the vortices 34 are shed and how the vortices impinge on lateral sides of the respective configurations.

Figure 4C:
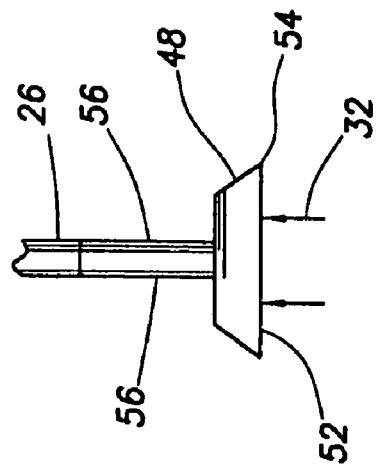
FIGS. 4A–D are side views of alternate configurations of vortex-shedding devices which may be used in the system of FIGS. 2 & 3.
Figure 4D:
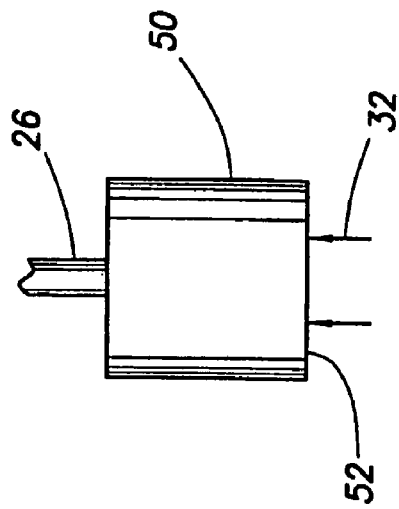
Figure 4A:
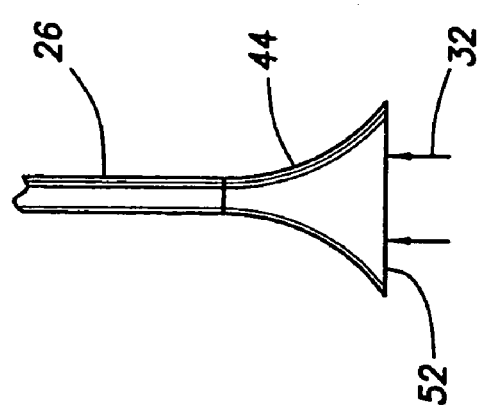

The configuration 48 depicted in FIG. 4C is presently preferred for the vortex shedding device 24. This is due in substantial part to: 1) its relatively sharp edge 54 formed around the face 52, which enables it to readily shed vortices 34 at relatively low velocities of the fluid flow 32; 2) its relatively uncomplicated shape, which makes it inexpensive to manufacture and reproduce with precision; and 3) its relatively large and flat lateral surface areas 56 downstream of the face 52, which enhance the lift forces produced when vortices shed by the device impinge on these surface areas.

Referring additionally now to FIG. 5, a graph of vortex shedding frequency (f) versus flow velocity (U) in the system 18 is representatively illustrated. A solid line 58 on the graph indicates a theoretical proportional relationship between the vortex shedding frequency (f) and the flow velocity (U) as predicted by the following equation:

$$St = (fD)/U \quad (1)$$

where St is a coefficient known as the Strouhal number, and D is a characteristic dimension of the vortex shedding device. For subterranean well applications using the system 18, in which the fluid flow 32 would likely have a Reynolds number of approximately $10^2$ to approximately $10^5$, the Strouhal number is expected to be approximately 0.1 to approximately 0.2. For the preferred vortex shedding device configurations 44, 46, 48, 50 described above, the characteristic dimension D may be a width of the face 52.

However, due to a phenomenon known to those skilled in the art as "lock in," the relationship between the vortex shedding frequency (f) and the fluid flow velocity (U) in the system 18 is not directly proportional for all flow velocities as described by the line 58. Instead, as the vortex shedding frequency (f) approaches the resonant frequency (represented by the horizontal dotted line 60 in FIG. 5) of the vibrating assembly 156, the vortex shedding frequency locks in (remains relatively constant) over a range of fluid flow velocity (U). This is depicted by the alternating dotted and dashed line 62 in FIG. 5, which has a substantially horizontal portion 64 indicating that, for a range of fluid flow velocity (U), the vortex shedding frequency (f) remains substantially constant at the resonant frequency 60 of the assembly 156.

Thus, the system 18 is preferably configured so that, at an expected or predetermined range of fluid flow velocity (U) through the system, its vortex shedding frequency (f) is substantially equal to the resonant frequency 60 of the assembly 156. The vortex shedding frequency (f) of the system 18 at a predetermined fluid flow velocity (U) may be adjusted by, for example, varying the characteristic dimension D in equation (1) above. The resonant frequency 60 of the assembly 156 may be adjusted by, for example, varying the rigidity of the arm 26 and/or elastic support 28, varying the length of the arm, varying the mass of the arm and the mass of the vortex shedding device 24, etc.

Referring additionally now to FIG. 6, internal components of another electrical power generating system 70 are representatively illustrated. The system 70 may be used for the system 18 in the well lo as illustrated in FIG. 1, or it may be used in other applications.

The system 70 includes a vibrating assembly 158 which comprises a vortex shedding device 72 attached at one end of an arm 74. An electrical power generator 76 is attached at an opposite end of the arm 74. An elastic support 78 is attached to the arm 74 between the device 72 and the generator 76.

Figure 4B:
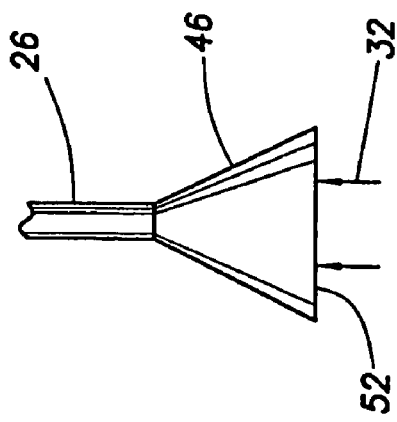

The vortex shedding device 72 is shaped somewhat like the configuration 46 depicted in FIG. 4B. The elastic support 78 has a generally I-shaped cross-section which permits rotational displacement (indicated by arrows 80) of the arm 74 about the support. The arm 74 is preferably substantially more rigid than the elastic support 78, so that only minimal flexing of the arm occurs during the vibrating displacement 80.

The generator 76 includes two permanent magnets 82 attached to the arm 74, and two corresponding stationary wire coils 84. Electricity is produced from the coils 84 when the magnets 82 are displaced in the coils due to the vibrating displacement 80 of the arm 74. Of course, any number of magnets 82 and coils 84 may be used, the magnets and coils may be differently configured or oriented, etc.

The magnets 82 and coils 84 may be used to produce an initial displacement of the arm 74, if desired. As described more fully below, an electric potential may be applied to one or both of the coils 84 to generate a magnetic field and thereby bias the magnets 82 to displace against the biasing force exerted by the elastic support 78. This will displace the arm 74 away from its neutral position and help to initiate the vibrating displacement 80 of the vibrating assembly 158.

Referring additionally now to FIG. 7, components of another electrical power generating system 86 are representatively illustrated. The system 86 may be used for the system 18 in the well 10 as illustrated in FIG. 1, or it may be used in other applications.

The system 86 includes a vibrating assembly 160 which comprises an arm 88 and a vortex shedding device 90 attached to a combined elastic support and generator 92. The vortex shedding device 90 is attached at one end of the arm 88, and two of the support and generator 92 are attached at an opposite end of the arm. The vortex shedding device 90 is similar to the configuration 48 depicted in FIG. 4C.

The support and generator 92 is similar in many respects to an actuator described in U.S. Pat. No. 5,907,211, the entire disclosure of which is incorporated herein by this reference. As described in that patent, the actuator uses stacks of piezoelectric elements and a leveraging mechanism. When an electric potential is applied to the piezoelectric elements, the elements deform, and this deformation is amplified by the leveraging mechanism so that a relatively large stroke is produced by the actuator. In the support and generator 92 of the system 86, however, electricity is produced (instead of being applied to the piezoelectric elements), and the leveraging mechanism reduces displacement (instead of amplifying displacement).

The support and generator 92 is depicted in FIG. 8 apart from the remainder of the system 86. In this view it may be seen that the support and generator 92 includes two stacks of electromagnetically active elements 94 positioned within a leveraging mechanism 96. A pivot 98 is at one end of the leveraging mechanism 96. An opposite end of the leveraging mechanism 96 has attachment portions 100 formed thereon. In the system 86 as depicted in FIG. 7, one of the attachment portions 100 is secured to the arm 88, and the other of the attachment portions 100 is attached to a generally tubular housing 102.

As the arm 88 vibrates (due to the fluid flow 32 through an internal passage 104 formed through the housing 102, and the resulting vortices 34 shed from the vortex shedding device 90), it rotates back and forth about a pivot 106 supporting the arm between the vortex shedding device and the two supports and generators 92. This vibrating displacement of the arm 88 is transmitted to the supports and generators 92 via the attachment portions 100. The vibrating displacement of the arm 88 transmitted to the supports and generators 92 causes strain to be induced in the elements 94 by the leveraging mechanisms 96.

The leveraging mechanisms 96 decrease the displacement of the arm 88 as applied to the elements 94, in order to achieve a better mechanical impedance match to the electromagnetically active material. The biasing forces produced by the flow-induced vibration tend to behave like a soft spring while many of the electromagnetically active materials behave like a hard spring. The leveraging mechanisms 96 allow more of the flow-induced energy to enter the electromagnetically active elements 94.

As described above, the elements 94 are electromagnetically active elements. The term "electromagnetically active" as used herein indicates a material which produces an electric potential and/or current (electro-active material), or a magnetic field (magneto-active material), when the material is subjected to strain. Examples of electromagnetically active materials include piezoelectrics (including piezoceramics, piezo-polymers, etc.), magnetostrictors and electrostrictors.

If the elements 94 are made of magnetostrictive material which produces a magnetic field when strained, then at least one wire coil (such as a coil 84) may be included in the supports and generators 92, so that the magnetic field will produce electricity in the coil. If the elements 94 are made of piezoelectric or electrostrictive material, then electricity is produced directly from the material when it is strained.

Preferably, the elements 94 are made of a piezoelectric material, are stacked in series as depicted in FIG. 8, and are electrically connected in parallel. As illustrated in FIG. 8, conductors 22 are connected to the elements 94 for providing electrical power to the well tool 20 as depicted in FIG. 1.

The supports and generators 92 also provide support for the arm 88. The supports and generators 92 bias the arm 88 toward a neutral position, due to the overall elasticity of the elements 94 and leveraging mechanism 96. If desired, a preload may be applied to the supports and generators 92, so that vibrating displacement of the arm 88 is most effectively transmitted to the elements 94 via the leveraging mechanisms 96, and so that the arm is retained at its neutral position when the fluid flow 32 is not sufficient to cause the arm to vibrate. The preload may be applied to maintain a compressive load on the elements 94 in order to reduce tensile fracture of the elements.

To produce an initial displacement of the arm 88, one or both of the supports and generators 92 may be used for its/their actuator capability. That is, an electric potential or magnetic field may be applied to the elements 94, thereby producing strain in the elements and causing the arm 88 to deflect in a desired direction. In this manner, an initial displacement of the arm 88 may be produced to initiate the vibrating displacement of the vibrating assembly 160 in response to the fluid flow 32.

Referring additionally now to FIG. 9, a lever device 110 is representatively illustrated. The lever device 110 may be used in the leveraging mechanism 96 in the support and generator 92. However, it should be clearly understood that the lever device 110 may be used in other mechanisms, devices and systems, in keeping with the principles of the invention.

Instead of the pivot 98 positioned at one end of substantially rigid members 154 (as depicted for the leveraging mechanism 96 in FIG. 8), the lever device 110 has flexure pivots 112 formed directly on a single piece of material. Thus, the lever device 110 may be used in place of the members 154 and pivot 98 in the leveraging mechanism 96.

The flexure pivots 112 are formed as relatively thin portions of the material, and are positioned closer to the attachments 100 than in the leveraging mechanism 96 as depicted in FIG. 8, giving a different mechanical ratio for transmitting displacement of the arm 88 to the elements 94. Integrally forming the lever device 110 from a single piece of material reduces the cost and complexity of the leveraging mechanism 96.

The pivot 106 may also be considered a part of the support for the arm 88. The pivot 106 attaches the arm 88 to the housing 102. The pivot 106 may also include one or more elastic elements which bias the arm 88 toward its neutral position.

As depicted in FIG. 7, the arm 88 and vortex shedding device 90 are positioned in a recess 108 formed in a sidewall of the housing 102. Although the recess 108 is shown in FIG. 7 as being open to an exterior of the housing 102, in actual practice a covering is preferably installed over the recess so that the fluid flow 32 is contained within the housing.

By positioning the arm 88 and vortex shedding device 90 in the recess 108, the passage 104 remains substantially unobstructed. This minimizes any pressure drop in the fluid flow 32 though the system 86, while providing access for wireline tools, coiled tubing, etc. through the passage 104.

Note that some or all of the vortex shedding device 90 and/or arm 88 may extend into the passage 104, in keeping with the principles of the invention.

Although being positioned in the recess 108, the arm 88 and vortex shedding device 90 are still exposed to the fluid flow 32 through the passage 104. The arm 88 is preferably positioned at an outer portion of the recess 108, however, so that it is exposed in large part only to boundary layer flow in the recess. This minimizes energy losses due to exposure of the arm 88 to the fluid flow 32.

The vortex shedding device 90 may be positioned so that a portion of the device extends into the passage 104. This exposes the vortex shedding device go to higher velocity fluid flow 32 in the passage 104, without substantially obstructing the passage.

Figures 10, 12:
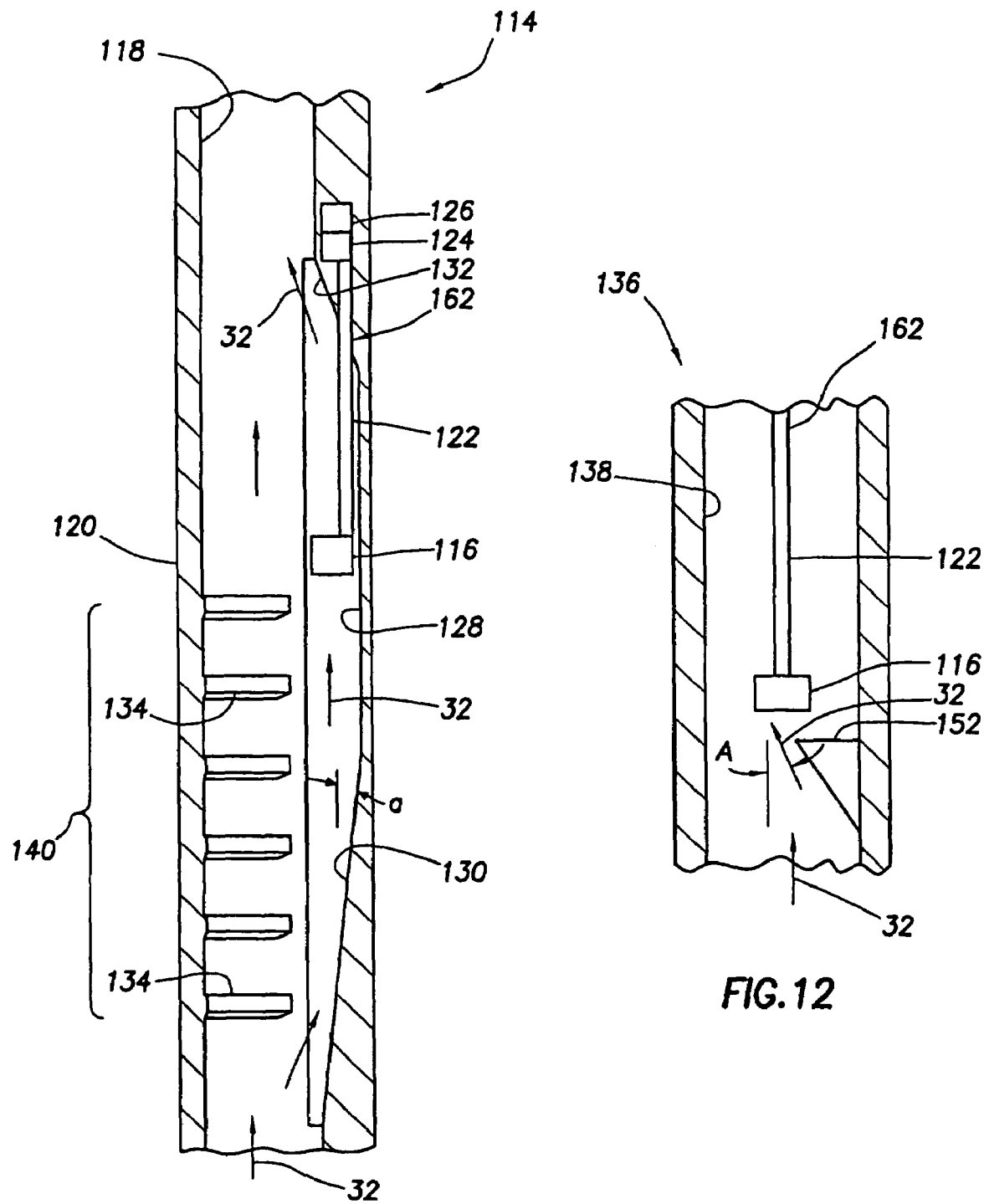
FIG. 10 is a partially cross-sectional view of a fourth electrical power generating system embodying principles of the present invention.
FIG. 12 is a partially cross-sectional view of a portion of the fifth system, taken along line 12—12 of FIG. 11.

Referring additionally now to FIG. 10, another electrical power generating system 114 is representatively illustrated. The system 114 demonstrates that various techniques may be used to increase the velocity of the fluid flow 32 which impinges on a vortex shedding device in a recess laterally offset from a passage.

The system 114 may be used for the system 18 in the well 10 as illustrated in FIG. 1, or it may be used in other applications. The system 114 includes features which enhance exposure of a vortex shedding device 116 to the fluid flow 32 through a passage 118 formed through a housing 120.

A vibrating assembly 162 of the system 114 includes the vortex shedding device 116 attached to an end of an arm 122. An opposite end of the arm 122 is attached to an elastic support 124 and an electrical generator 126. The elastic support 124 and generator 126 may be similar to any of the supports and generators described above, or other types of supports and generators may be used if desired.

The vortex shedding device 116 and arm 122 are positioned in a recess 128 formed in a sidewall of the housing 120 laterally offset from the passage 118. Since the recess 128 is in communication with the passage 118 along its entire length, the vortex shedding device 116 is also exposed to the fluid flow 32 through the passage 118.

To increase the velocity of the fluid flow 32 impinging on the vortex shedding device 116, upstream and downstream surfaces 130, 132 of the recess 128 are inclined relative to a longitudinal axis of the passage 118 at an angle (a) substantially less than 90 degrees. This provides a gradual transition for the fluid flow 32 between the passage 118 and the recess 128, thereby reducing turbulence in the flow and increasing the velocity of the flow in the recess.

To enhance diversion of the fluid flow 32 toward the recess 128, a flow diverter 140 including a series of longitudinally spaced apart and circumferentially extending projections 134 is formed in the housing 120. The projections 134 extend into the passage 118, but not into the recess 128. In this manner, flow through the passage 118 is somewhat restricted, thereby diverting more of the fluid flow 32 toward the recess 128 and increasing the velocity of the fluid flow in the recess.

Other means of diverting the fluid flow 32 toward the recess 128 may be used, including those described in U.S. patent application Ser. No. 10/658,899, entitled BOREHOLE DISCONTINUITIES FOR ENHANCED POWER GENERATION, filed Sep. 10, 2003, the entire disclosure of which is incorporated herein by this reference.

Note that the arm 122 is positioned in a portion of the recess 128 near its outermost extent and relatively close to the housing 120 sidewall. This positioning of the arm 122 places it substantially in a boundary layer of the fluid flow 32 in the recess 128, or at least in a region of reduced flow and turbulence, thus reducing energy lost due to displacement of the arm in the fluid.

Referring additionally now to FIG. 11, another electrical power generating system 136 is representatively illustrated. The system 136 is similar in many respects to the system 114 described above, and so elements depicted in FIG. 11 which are similar to those described above are indicated using the same reference numbers. The system 136 may be used for the system 18 in the well 10 as illustrated in FIG. 1, or it may be used in other applications.

The system 136 differs from the system 114 in one respect in that, instead of the recess 128, the system 136 includes a channel 138 which is laterally offset from the passage 118. The channel 138 is preferably formed in a sidewall of the housing 142 and is separated from the passage by a wall 144. However, opposite ends of the channel 138 are in fluid communication with the passage 118, so that the fluid flow 32 may pass from the passage 118 into the channel 138 and back to the passage. The wall 144 serves to protect the vortex shedding device 116 and arm 122 from debris, tools, etc. which may pass through the passage 118.

The system 136 also differs from the system 114 in another respect in that, instead of the projections 134, the system 136 has a flow diverter 146 which includes a pivotably mounted vane 148. A biasing device 150, such as a spring, biases the vane 148 to restrict flow through the passage 118 at the wall 144 as depicted in FIG. 11, thereby diverting the fluid flow 32 toward the channel 138. If at some point it is desired to provide access to the passage 118 below the vane 148, the vane may be rotated out of the way (counterclockwise as depicted in FIG. 11) against the biasing force exerted by the biasing device 150.

Referring additionally now to FIG. 12, a side view of the system 136 is representatively illustrated, taken along line 12—12 of FIG. 11. In this view another method of increasing the velocity of the fluid flow 32 impinging on the vortex shedding device 116 in the channel 138 is illustrated.

Specifically, a flow diverter 152 is positioned in the channel 138 upstream of the vortex shedding device 116. Preferably, the diverter 152 is positioned upstream from the vortex shedding device 116 a distance somewhat less than the width of the face of the vortex shedding device, and the diverter blocks about half of the flow area of the channel 138. By reducing the flow area of the channel 138 just upstream of the vortex shedding device 116, the velocity of the fluid flow 32 impinging on the vortex shedding device is increased.

In addition, the diverter 152 causes the fluid flow 32 to impinge on the vortex shedding device 116 at an angle (A) relative to the longitudinal axis of the passage 118. Preferably, the angle (A) is substantially greater than zero and is in the range of approximately 20 degrees to approximately 60 degrees. This angular impingement of the fluid flow 32 on the vortex shedding device 116 may enhance initiation of vibrating displacement of the assembly 162. Note that the diverter 152 may also, or alternatively, be used in the recess 108 in the system 86 upstream of the vortex shedding device go, and in the recess 128 in the system 114 upstream of the vortex shedding device 116.

Referring additionally now to FIG. 13, another electrical power generating system 164 is representatively illustrated. The system 164 is similar in many respects to the system 70 described above (see FIG. 6), and so elements depicted in FIG. 13 which are similar to those described above are indicated using the same reference numbers. The system 164 may be used for the system 18 in the well 10 as illustrated in FIG. 1, or it may be used in other applications.

The system 164 differs from the system 70 in one respect in that a generator 166 of the system includes two stacks of electromagnetically active elements 168 positioned within the two coils 84. Each stack of electromagnetically active elements 168 is also positioned between one of the magnets 82 and an outer generally tubular housing 170 having a passage 172 through which the fluid flow 32 passes.

As the vibrating assembly 158 displaces (as indicated by arrows 80), strain is produced in the elements 168, thereby generating either a magnetic field (e.g., if the elements are made of magnetostrictive material) which produces electricity in the coils 84, or generating electricity in the elements (e.g., if the elements are made of piezoelectric or electrostrictive material). Thus, electricity is produced from the strain in the elements 168, in addition to electricity being produced due to displacement of the magnets 82 relative to the coils 84 (which will be relatively minimal compared to that produced due to strain in the elements 168). Furthermore, the magnets 82 provide a magnetic bias on the elements 168 (if the elements are made of a magnetostrictive material) which increases the magnetic flux produced due to a given strain.

Preferably, the elements 168 are stacked in series and are electrically connected in parallel (if the elements are made of piezoelectric or electrostrictive material). Note that the elements 168 (and associated coil 84, if the elements are made of magnetostrictive material) may be used in any of the electrical power generating systems described herein, in order to produce electricity from displacement of the vibrating assembly in each system. Note, also, that it is not necessary for the magnets 82 to be provided in the system 164, since strain in the elements 168 can be used to produce electricity without use of the magnets.

Figure 14:
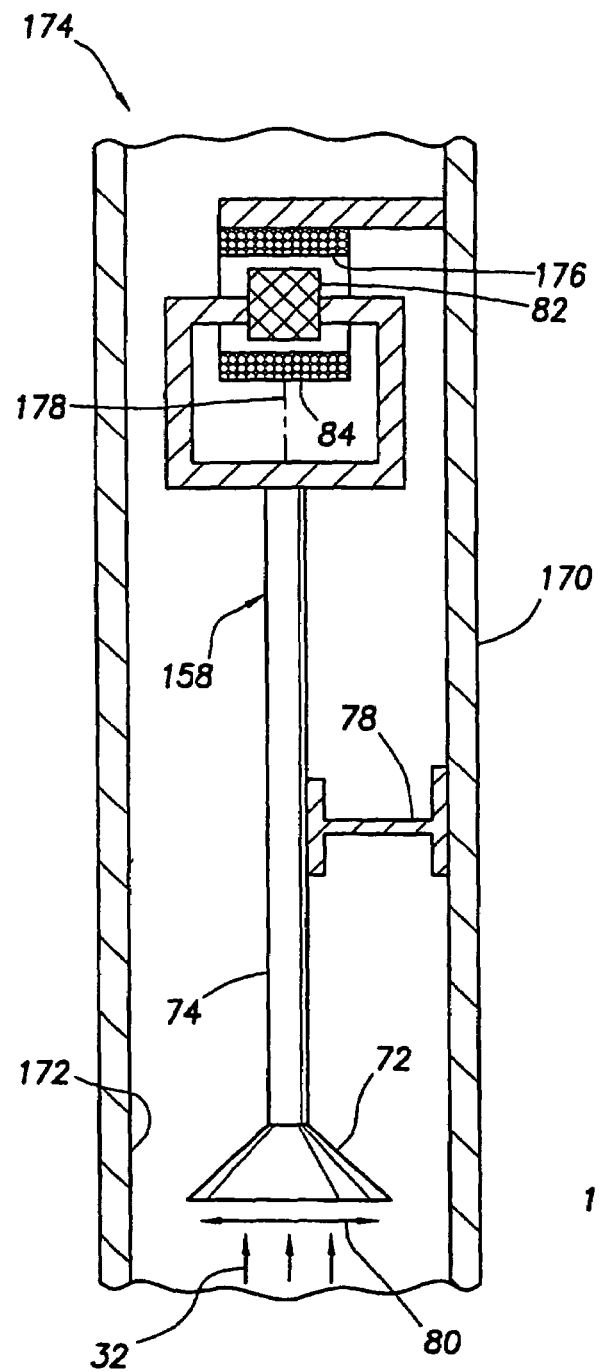
FIG. 14 is a partially cross-sectional view of a seventh electrical power generating system embodying principles of the present invention.

Referring additionally now to FIG. 14, another electrical power generating system 174 is representatively illustrated. The system 174 is similar in many respects to the system 164 described above, and so elements depicted in FIG. 14 which are similar to those described above are indicated using the same reference numbers. The system 174 may be used for the system 18 in the well 10 as illustrated in FIG. 1, or it may be used in other applications.

The system 174 differs from the system 164 in one respect in that it includes one magnet 82 attached to the arm 74. The magnet 82 is displaced relative to the coil 84 when the vibrating assembly 158 displaces in response to the fluid flow 32. The coil 84 is substantially rigidly mounted relative to the housing 170. Of course, other numbers of magnets 82 and coils 84 may be used, and the coil 84 could be displaced by the vibrating assembly 158 while the magnet 82 remains rigidly mounted, without departing from the principles of the invention.

One beneficial feature of the system 174 is that a passage 176 formed through the coil 84 is in fluid communication with the passage 172 formed through the housing 170 at each opposite end of the coil. The magnet 82 displaces in the passage 176 when the vibrating assembly 158 displaces. This configuration helps to prevent accumulation of debris within the coil 84. An additional benefit of the system 174 is that the speed with which the magnet 82 displaces through the coil 84 is increased (due to a decreased mass), which increases the rate of magnetic flux change, and as a result leads to higher generated voltages.

In addition, each of the magnet 82 and coil 84 is preferably aligned with a longitudinal axis 178 of the vibrating assembly 158, which provides for reduced obstruction of the passage 172. Of course, the system 174, as well as each of the other systems described herein, may be positioned in a laterally offset recess or channel (as described above and illustrated in FIGS. 10–12) to further reduce obstruction to the fluid flow 32 and enhance access through the passage 172.

Figure 15:
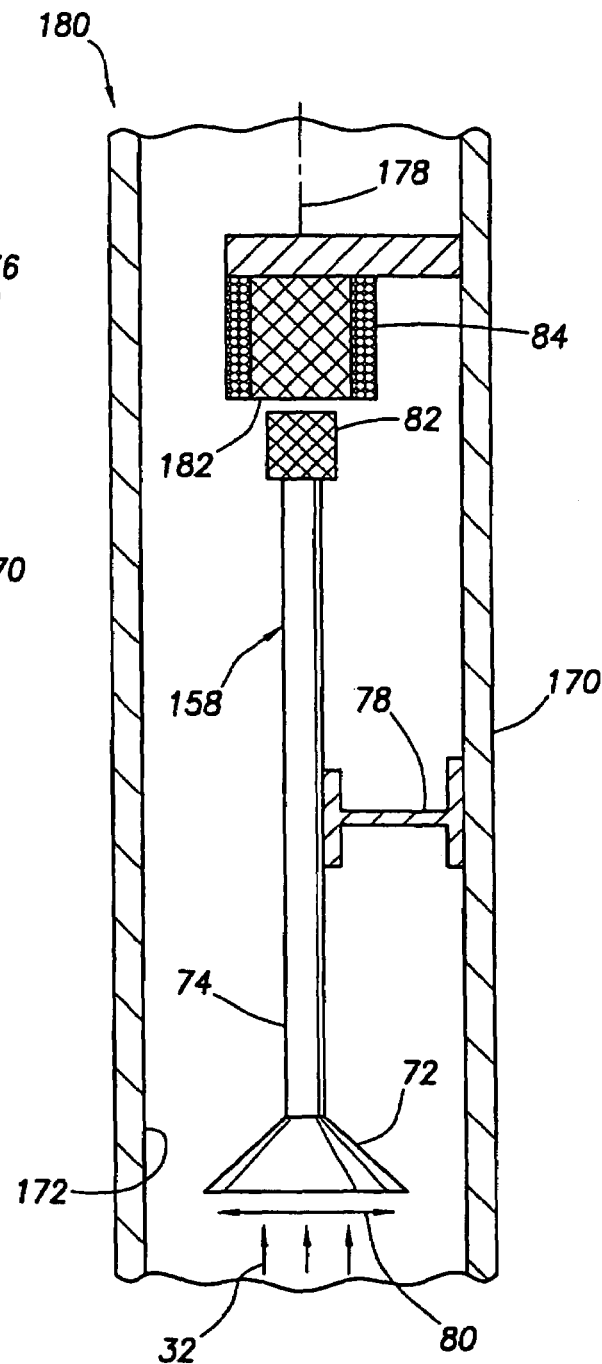
FIG. 15 is a partially cross-sectional view of an eighth electrical power generating system embodying principles of the present invention.

Referring additionally now to FIG. 15, another electrical power generating system 180 is representatively illustrated. The system 180 is similar in many respects to the system 174 described above, and so elements depicted in FIG. 15 which are similar to those described above are indicated using the same reference numbers. The system 180 may be used for the system 18 in the well 10 as illustrated in FIG. 1, or it may be used in other applications.

The system 180 differs from the system 174 in one respect in that, instead of displacing the magnet 82 in the passage 176 of the coil 84, the magnet is displaced relative to a ferromagnetic core 182 in the coil. Of course, the coil 84 and core 182 could be displaced relative to the magnet 82, and multiple coils, cores and magnets could be used, in keeping with the principles of the invention.

The ferromagnetic core 182 could be made of materials such as steel, nickel, etc., or any other material capable of directing magnetic flux from the magnet 82 through the coil 84. As the magnet 82 displaces relative to the core 182, the magnetic flux density in the core (and, thus, in the coil 84) changes, thereby producing electricity in the coil.

One beneficial feature of the system 180 is that the core 182 prevents debris from entering the coil 84. Furthermore, as with the system 174, the coil 84 and magnet 82 are aligned with the longitudinal axis 178 of the vibrating assembly 158, so the passage 172 is less obstructed.

Figures 16, 17:
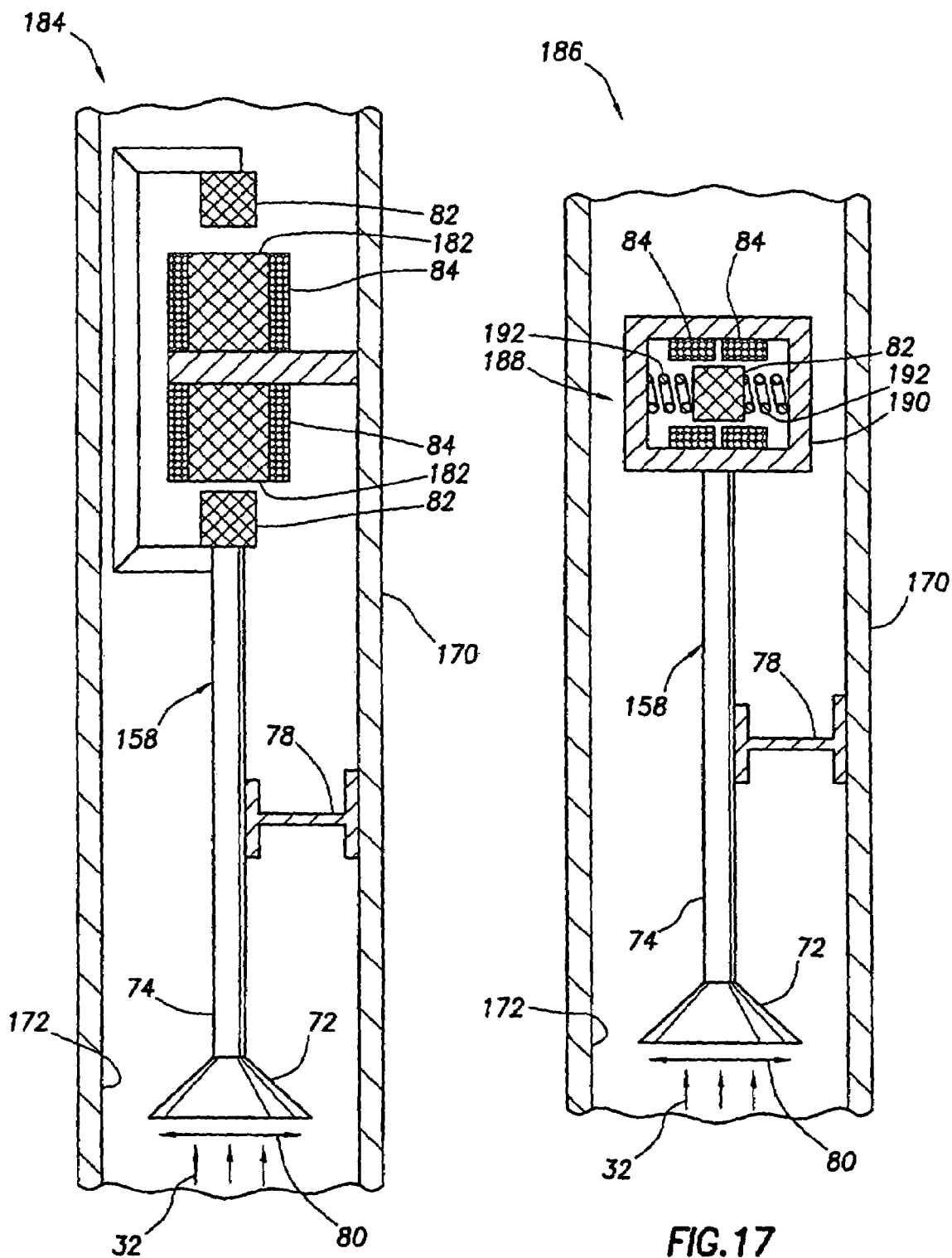
FIG. 16 is a partially cross-sectional view of a ninth electrical power generating system embodying principles of the present invention.
FIG. 17 is a partially cross-sectional view of a tenth electrical power generating system embodying principles of the present invention.

Referring additionally now to FIG. 16, another electrical power generating system 184 is representatively illustrated. The system 184 is very similar to the system 180 described above, except that multiple magnets 82 are displaced by the vibrating assembly 158 relative to respective multiple ferromagnetic cores 182 positioned in respective multiple coils 84. Of course, the coils 84 and cores 182 could be displaced relative to the magnets 82 in keeping with the principles of the invention. One beneficial feature of the system 184 as compared to the system 180 is that an increased level of electrical power is produced by the multiple sets of magnets 82 and coils 84. Another beneficial feature of the system 184 as compared to the system 180 is a reduced magnetic reluctance of the magnetic circuit.

Referring additionally now to FIG. 17, another electrical power generating system 186 is representatively illustrated. The system 186 is similar in many respects to the system 174 described above, and so elements depicted in FIG. 17 which are similar to those described above are indicated using the same reference numbers. The system 186 may be used for the system 18 in the well 10 as illustrated in FIG. 1, or it may be used in other applications.

The system 186 differs from the other systems described above in one respect in that a magnet 82 and coils 84 included in a generator 188 of the system are enclosed within a housing 190 attached to the arm 74. The magnet 82 is movably supported within the coils 84 by biasing devices 192 positioned between the housing 190 and each end of the magnet. As the vibrating assembly 158 displaces in response to the fluid flow 32, the housing 190 will also displace back and forth, causing the mass of the magnet 82 to alternately compress the biasing devices 192, and thereby permitting the magnet to displace relative to the coils 84.

The biasing devices 192 are representatively illustrated in FIG. 17 as being compression springs, but it should be clearly understood that other types of biasing devices may be used to movably support the magnet 82. For example, elastomeric stoppers, compressed fluid, magnets having poles which repel poles of the magnet 82, etc. may be used to bias the magnet toward a neutral position relative to the coils 84. Alternatively, the magnet 82 could displace relative to the coils 84 without use of any biasing device.

The housing 190 prevents the fluid flow 32 and any debris from contacting the magnet 82 and coils 84. The interior of the housing 190 could be at atmospheric or another pressure (e.g., by sealing air or a gas within the housing), or it could be pressure balanced with respect to the passage 172.

In the system 186, and in the other systems described herein which utilize a magnet and coil to produce electricity, it may be beneficial to be able to initiate displacement of the vibrating assembly using the magnet and coil. In this manner, displacement of the vibrating assembly could be initiated at lower rates of the fluid flow 32. For example, in the system 186, an electric potential could be applied to one or both of the coils 84 to generate a magnetic field which would cause the magnet 82 to displace relative to the coils. This displacement of the magnet 82 relative to the coils 84 would compress one of the biasing devices 192, thereby causing the arm 74 to displace in response. Once the arm 74 is displaced away from its neutral position, the elastic support 78 will bias the arm back toward the neutral position and, thus, displacement of the vibrating assembly 158 will be initiated. Once the displacement 80 is initiated, the vortices shed by the vortex shedding device 72 due to the fluid flow 32 will continue to displace the assembly 158 back and forth.

Figure 18:
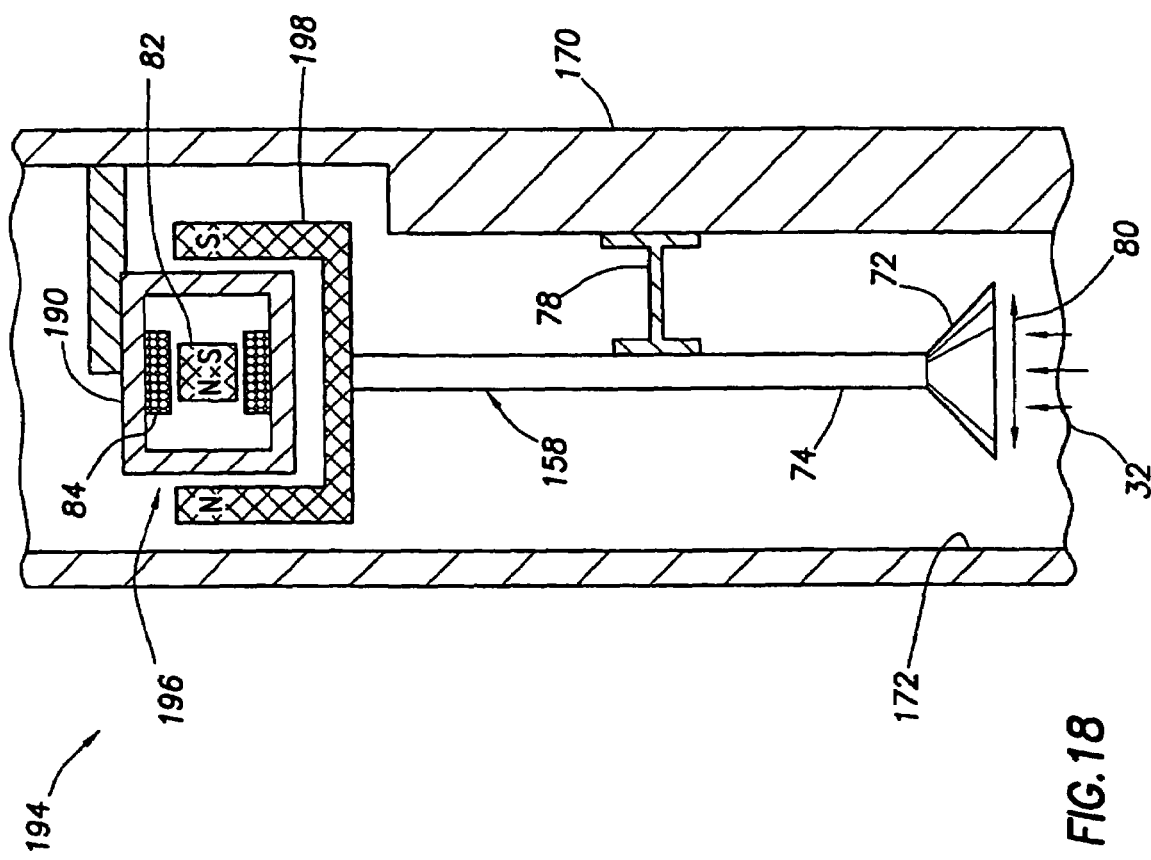
FIG. 18 is a partially cross-sectional view of an eleventh electrical power generating system embodying principles of the present invention.

Referring additionally now to FIG. 18, another electrical power generating system 194 is representatively illustrated. The system 194 is similar in many respects to the system 186 described above, and so elements depicted in FIG. 18 which are similar to those described above are indicated using the same reference numbers. The system 194 may be used for the system 18 in the well 10 as illustrated in FIG. 1, or it may be used in other applications.

The system 194 has a generator 196 which includes the magnet 82 and coil 84 positioned within the housing 190. However, the housing 190 is substantially rigidly mounted relative to the vibrating assembly 158, instead of being attached to the arm 74 as in the system 186. In addition, no biasing device is used in the housing 190 to support the magnet 82 relative to the coil 84.

The magnet 82 is displaced relative to the coil 84 by another magnet 198, which is attached to the arm 74. The magnet 198 displaces with the arm 74 when the assembly 158 vibrates in response to the fluid flow 32. The magnet 198 is configured and positioned relative to the magnet 82 so that corresponding poles of the magnets repel each other. Thus, when the magnet 198 displaces, the repelling forces between the poles of the magnets 82, 198 bias the magnet 82 to displace along with the magnet 198. Displacement of the magnet 82 relative to the coil 84 causes electricity to be produced in the coil.

As described above, an electric potential may be applied to the coil 84 to initiate displacement of the vibrating assembly 158. In this case, the electric potential applied to the coil 84 will cause the magnet 82 to displace relative to the coil. Displacement of the magnet 82 will cause a corresponding displacement of the magnet 198, due to the repelling forces between corresponding poles of the magnets. This displacement of the magnet 198 initiates displacement of the vibrating assembly 158, which will continue to displace back and forth due to the vortices shed by the vortex shedding device 72 in response to the fluid flow 32.

Figure 19:
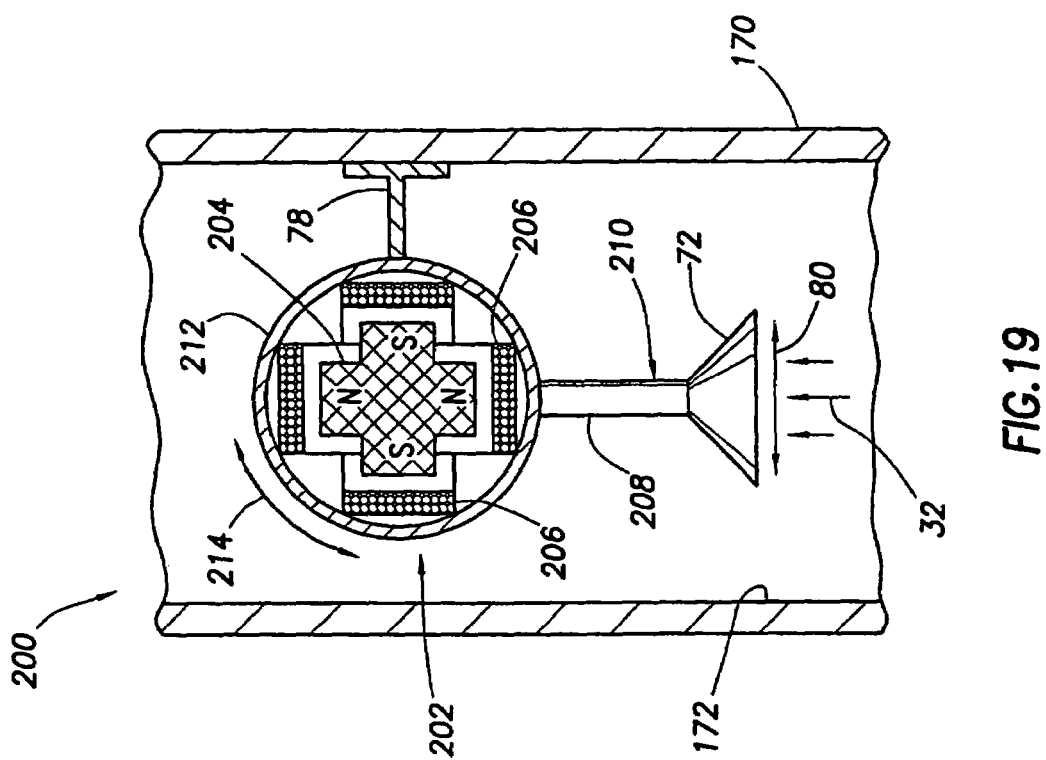
FIG. 19 is a partially cross-sectional view of a twelfth electrical power generating system embodying principles of the present invention.

Referring additionally now to FIG. 19, another electrical power generating system 200 is representatively illustrated. Elements of the system 200 which are similar those previously described are indicated in FIG. 19 using the same reference numbers. The system 200 may be used for the system 18 in the well 10 as illustrated in FIG. 1, or it may be used in other applications.

The system 200 differs in one respect from the other systems described above, in that it includes a generator 202 in which relative rotational displacement between a magnet 204 and coils 206 is used to produce electricity in the coils. The magnet 204 may actually be made up of multiple individual magnets.

As in the other systems described above, the system 200 has a vibrating assembly 210 which includes the vortex shedding device 72 attached to an arm 208. Vortices shed by the device 72 in response to the fluid flow 32 cause the arm 208 to displace back and forth (as indicated by the arrows 80).

A housing 212 of the generator 202 encloses the magnet 204 and coils 206. The housing 212 is attached to the arm 208 and to the elastic support 78. As the arm 208 displaces back and forth, the elastic support 78 flexes and rotational displacement (indicated by arrows 214) of the housing 212 is produced.

The coils 206 are attached to, and rotate with, the housing 212. Rotation of the coils 206 relative to the magnet 204 causes electricity to be produced in the coils 206. Of course, the magnet 204 could be attached to the housing 212 for rotation relative to the coils 206 in keeping with the principles of the invention.

Preferably, the housing 212 is positioned at or near a center of rotation of the vibrating assembly 210. This reduces the rotational inertia of the generator 202, permitting the assembly 210 to vibrate at lower rates of the fluid flow 32. Note that an-electric potential may be applied to one or both of the coils 206 to initiate the rotational displacement 214 of the housing 212 and thereby initiate vibrating displacement 80 of the assembly 210.

Referring additionally now to FIG. 20, a magnet configuration 216 is representatively illustrated. The magnet configuration 216 may be used in any of the systems described herein which utilize one or more magnets in a generator to produce electricity. It should be clearly understood that any type of magnet (permanent magnet, electromagnet, combinations of magnets and ferromagnetic material etc.), any number of magnets, and any configurations of magnets may be used in the systems described herein, in keeping with the principles of the invention.

The magnet configuration 216 depicted in FIG. 20 uses two permanent magnets 218 separated by a ferromagnetic spacer 220. The spacer 220 directs and concentrates a magnetic field 222 produced by the magnets 218. Note that similar poles of the magnets 218 (the "S" or south poles of the magnets as depicted in FIG. 20) are each positioned proximate the spacer 220. Additional magnets 218 and spacers 220 may be used if desired to produce a magnetic field 222 having an even higher density.

Note that the spacer 220 is not necessary to produce an increased magnetic flux density, since merely positioning the similar poles of the magnets 218 proximate each other will increase the magnetic flux density generated by the magnets. The spacer 220 could be made of metals other than ferromagnetic materials, and the spacer 220 could instead be an adhesive, elastomer, etc.

Figure 21:
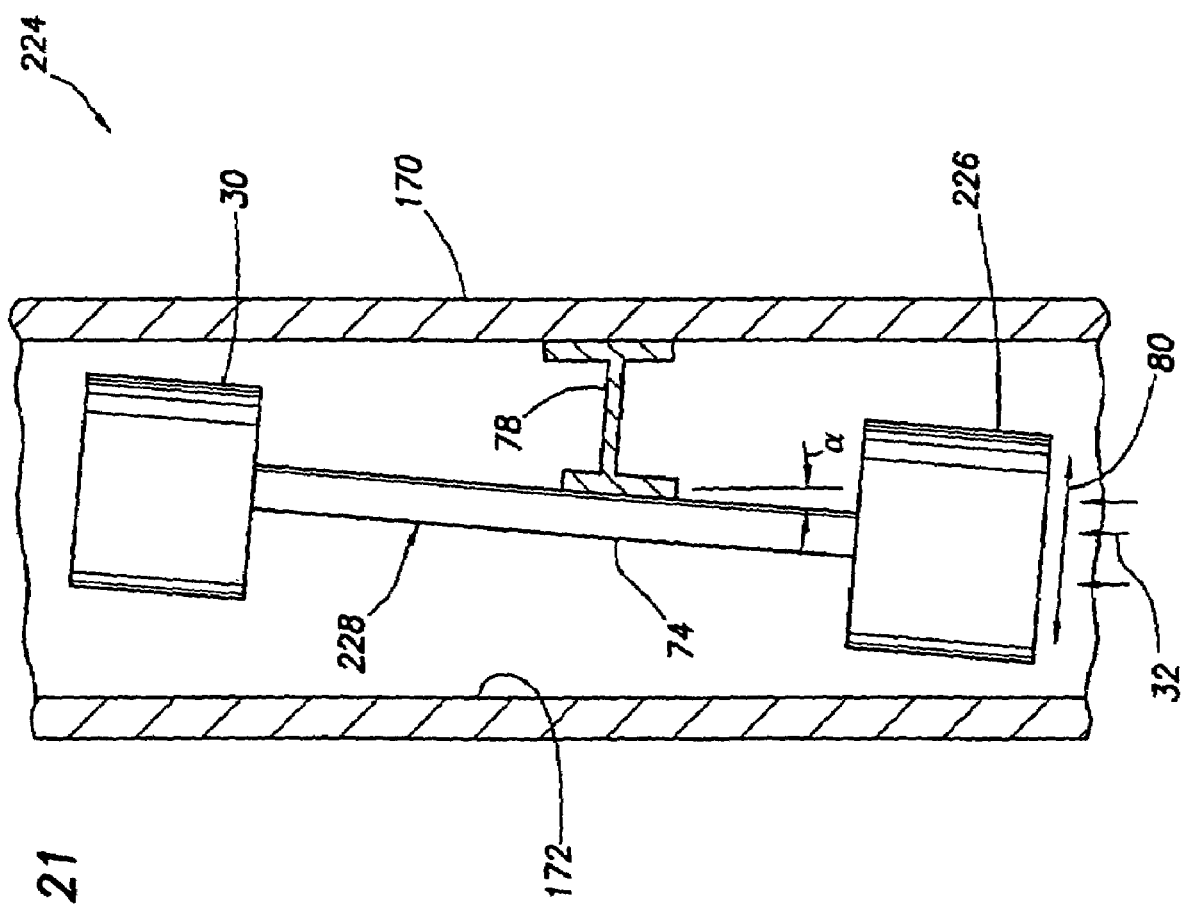
FIG. 21 is a partially cross-sectional view of a thirteenth electrical power generating system embodying principles of the present invention.

Referring additionally now to FIG. 21, another electrical power generating system 224 is representatively illustrated.

The system 224 is similar in many respects to systems described above, and so elements of the system which are similar to those previously described are indicated in FIG. 21 using the same reference numbers. The system 224 may be used for the system 18 in the well 10 as illustrated in FIG. 1, or it may be used in other applications.

The system 224 differs in one respect from the other systems described above in that it does not use a vortex shedding device to produce vortices having a frequency related to a resonant frequency of a vibrating assembly. Instead, the system 224 uses alternating lift coefficients produced by a lift reversal device 226 attached to the arm 74 in a vibrating assembly 228 in order to induce the vibrating displacement 80 of the assembly.

Figure 22:
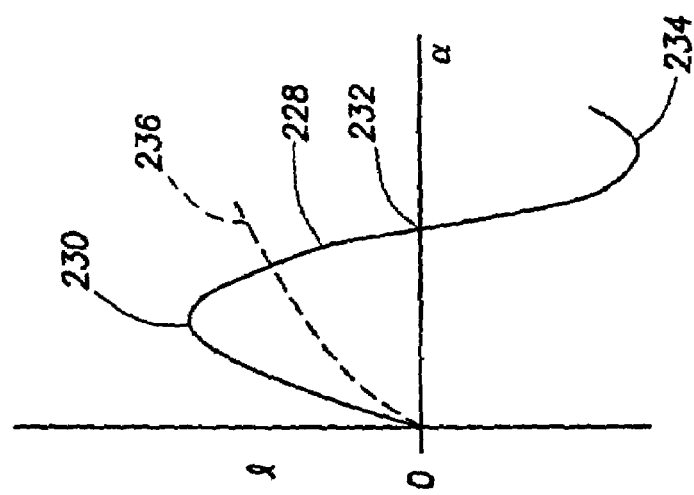
FIG. 22 is a plot of lift coefficient versus angle of attack for the thirteenth system of FIG. 21.

As depicted in FIG. 21, the lift reversal device 226 is preferably a rectangular prism-shaped device attached at an upstream end of the arm 74. The lift coefficient (l) produced by the device 226 is dependent upon an angle of attack ($\alpha$) of the device relative to the fluid flow 32. FIG. 22 depicts with a solid line 228 a plot of the lift coefficient versus angle of attack for the lift reversal device 226.

As can be seen from the plot 228, the lift coefficient increases relatively rapidly as the angle of attack increases from zero. However, the lift coefficient eventually reaches a maximum positive value 230, at which point a further increase in the angle of attack begins to reduce the lift coefficient. Still further increases in the angle of attack will eventually cause the lift coefficient to return to zero, at which point 232 a further increase in the angle of attack will cause the lift coefficient to go negative. The lift coefficient eventually reaches a maximum negative value 234, at which point a further increase in the angle of attack again increases the lift coefficient.

The plot 228 may be compared to a dashed line plot 236 of lift coefficient versus angle of attack for a conventional airfoil (not shown). Note that lift reversal does not occur for the airfoil. Instead, the lift coefficient initially increases with increased angle of attack, but then the increase in lift coefficient gradually diminishes, until boundary layer separation occurs. Thus, an airfoil shape would not be preferred for the lift reversal device 226.

The lift reversal produced by the lift reversal device 226 in response to the fluid flow 32 is used in the system 224 to produce back and forth vibrating displacement 80 of the vibrating assembly 228. As the lift coefficient increases, the arm 74 is increasingly biased to deflect in a first direction away from its neutral position. Increased deflection of the arm 74 increases the angle of attack of the lift reversal device 226 relative to the fluid flow 32, thereby initially further increasing the lift coefficient. Eventually (with increased angle of attack), the lift coefficient begins to decrease and returns to zero, at which point the arm 74 is no longer biased in the first direction, and the elastic support 78 returns the arm to and beyond its neutral position.

The angle of attack then goes negative, the lift coefficient again increases, and the arm 74 is increasingly biased to deflect in an opposite second direction away from its neutral position. Eventually (with increased angle of attack), the lift coefficient begins to decrease and again returns to zero, at which point the arm 74 is no longer biased in the second direction, and the elastic support 78 again returns the arm to and beyond its neutral position. This process is repeated over and over, thereby producing the vibrating displacement 80 of the vibrating assembly 228.

This vibrating displacement 80 is used by the generator 30 to produce electricity. The generator 30 may be any type of electrical power generator which is capable of producing electricity from the displacement 80, including any of the generators described herein.

The angle of attack ($\alpha$) of the lift reversal device 226 relative to the fluid flow 32 may be part of the system 224 configuration as initially installed. Alternatively, the angle of attack may be initiated by producing an initial deflection of the arm 74 after installation of the system 224 and after the fluid flow 32 has been initiated. For example, if the generator 30 includes a magnet and coil, an electric potential may be applied to the coil to produce a displacement of the magnet relative to the coil, thereby producing a displacement of the arm 74, as described above. As another example, if the generator includes an electromagnetically active element, an electric potential or magnetic field may be applied to the element to produce strain in the element, thereby producing a displacement of the arm 74, as also described above. As yet another example, a flow diverter, such as the diverter 152 depicted in FIG. 12, may be used to divert the fluid flow 32 so that it impinges on the lift reversal device 226 at a nonzero angle relative to the passage 172. Any means of producing an initial angle of attack of the lift reversal device 226 relative to the fluid flow 32 may be used in keeping with the principles of the invention.

Referring additionally now to FIG. 23, another electrical power generating system 238 is representatively illustrated. The system 238 is similar in some respects to other systems described above, and so elements depicted in FIG. 23 which are similar to those previously described are indicated using the same reference numbers. The system 238 may be used for the system 18 in the well 10 depicted in FIG. 1, or it may be used in other applications.

The system 238 includes the vortex shedding device 72 which produces the back and forth displacement 80 in response to the fluid flow 32 through the passage 172 formed through the housing 170. However, the vortex shedding device 72 is attached to an upstream end of an arm 240 which is secured via a pivot 242 to the housing 170. The arm 240 and device 72 are included in a vibrating assembly 254 of the system 238.

The pivot 242 serves to support the arm 240, but preferably does not bias the arm toward a neutral position. Instead, the arm 240 is biased toward its neutral position by a membrane 244. The membrane 244 includes a relatively rigid portion 246 and a relatively flexible portion 248. The arm 240 is preferably attached to the rigid portion 246 of the membrane 244.

The membrane 244 performs at least two important functions in the system 238. First, the membrane 244 serves as at least a portion of an elastic support 256 for the arm 240, in that the flexible portion 248 helps to bias the arm toward a neutral position. Second, the membrane 244 serves to isolate at least a portion of a generator 250 from the fluid flow 32 in the passage 172. The generator 250 is depicted in FIG. 23 as being positioned in a recess 252 formed in a sidewall of the housing 170, with the membrane 244 isolating the recess from the passage 172.

The generator 250 is also depicted in FIG. 23 as including the stack of electromagnetically active elements 168. However, it should be clearly understood that any type of generator capable of transforming the displacement 80 into electrical power may be used, including any of the various generators described herein, in keeping with the principles of the invention. Note that the elements 168 may also be considered part of the support for the arm 240, since their elasticity (or lack thereof) will influence how the vibrating assembly 254 responds to the fluid flow 32.

In operation, the fluid flow 32 causes the device 72 to shed vortices (not shown) at a resonant frequency of the vibrating assembly 254. This produces the back and forth lateral displacement 80 of the arm 240 at the device 72, which rotates the arm about the pivot 242. At the attachment between the arm 240 and the membrane 244, the displacement 80 is again substantially laterally directed.

The displacement 80 is transmitted via the membrane 244 to the elements 168, thereby producing strain in the elements. The displacement 80 is axially directed relative to the elements 168, thereby producing axial strain in the elements. This strain in the elements 168 produces electricity directly from the elements (e.g., if the elements are made of a piezoelectric or electrostrictive material) or a magnetic field (e.g., if the elements are made of a magnetostrictive material). If a magnetic field is produced by strain in the elements 168, then the generator 250 may also include a coil (not shown) in which electricity is produced in response to the magnetic field.

Note that displacement of the arm 240 may be initiated by applying an electric potential or magnetic field to the elements 168, thereby producing strain in the elements and deflecting the membrane 244. This initial displacement of the arm 240 may be used to initiate the vibrating displacement 80 of the assembly 254 in response to the fluid flow 32.

Referring additionally now to FIG. 24, another electrical power generating system 260 is representatively illustrated. The system 260 may be used for the system 18 in the well 10 depicted in FIG. 1, or it may be used in other applications.

The system 260 includes a vortex shedding device 262 attached at an upstream end of an elongated beam 264. An opposite end of the beam 264 is rigidly mounted.

An electromagnetically active material 266 is attached to opposing lateral sides of the beam 264. As fluid flow (indicated by arrows 268) impinges on the vortex shedding device 262, the device sheds vortices (not shown in FIG. 24, see vortices 34 depicted in FIG. 3) which produce alternating lift forces on the device and beam 264. These lift forces produce back and forth vibrating displacement (indicated by arrows 270) of the free end of the beam 264, thereby producing alternating strain in the beam.

Preferably, the vortex shedding device 262 sheds the vortices 34 at a frequency which is substantially equal to a resonant frequency of a vibrating assembly 272 of the system 260. The vibrating assembly 272 as depicted in FIG. 24 includes the beam 264, the vortex shedding device and the material 266. Other elements which influence the resonant frequency of the assembly 272 may be included in the assembly.

The system 260 is preferably configured so that, for a range of expected velocities of the fluid flow 268, the lock-in phenomenon will occur as represented by the substantially horizontal portion 64 of the graph depicted in FIG. 5 and described above. That is, the vortex shedding frequency (f) will remain substantially constant at the resonant frequency of the assembly 272. This will enhance the amplitude of the displacement 270, thereby increasing the strain in the beam 264, and thus increasing the strain imparted to the material 266.

If the material 266 is a piezoelectric or electrostrictive material, the strain imparted to the material will produce electricity in the material. If the material 266 is a magnetostrictive material, the strain imparted to the material will produce a magnetic field, which may be used to produce electricity in a coil (not shown). Thus, the material 266 coupled to the vibrating beam 264 may be considered a generator 274 of the system 260.

In addition to being used to generate electricity, the system 260 may also be used as a sensor to detect the velocity of the fluid flow 268. It is believed that the amplitude of the displacement 270 (and thus the strain in the beam 264 and the electrical energy output by the material 266) will be proportional to the velocity of the fluid flow 268. Therefore, by measuring the electrical energy output by the material 266, an indication is given of the velocity of the fluid flow 268.

Note that it is not necessary for the beam 264 to have the shape depicted in FIG. 24. A similar system 280 representatively illustrated in FIG. 25 includes a beam 282 with a nonuniform shape (e.g., a tapered shape). In order to prevent over-straining the material 266, or to provide more energy into the electromagnetically active material, it is attached to a relatively thicker portion 284 of the beam 282 near the rigidly mounted end of the beam. Variations in the shape of the beam 282 may also be used to modify the resonant frequency of a vibrating assembly 286 of the system 280, so that it will match a frequency of vortices shed by the device 262 at expected fluid flow velocities, to match the frequencies of vortices shed by the device 262 at a wider range of fluid flow velocities, or for other reasons. The shape of the beam 282 may provide a better mechanical impedance match with the fluid-induced vibrations.

Figure 27:
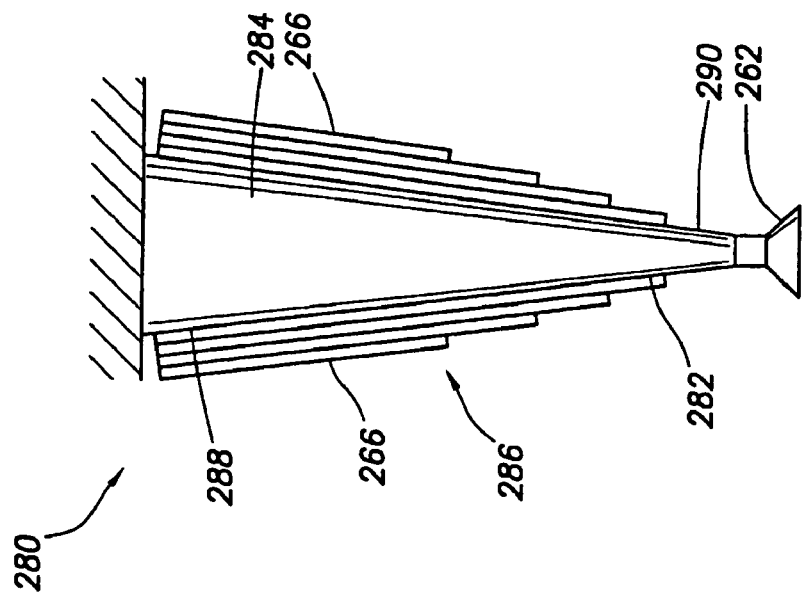
FIG. 27 is a schematic view of an alternate configuration of the sixteenth electrical power generating system.

It is also not necessary for the material 266 to have a uniform thickness on the beam 264 in the system 260, or on the beam 282 in the system 280. It will be appreciated by one skilled in the art that there is increased strain energy produced in the rigidly mounted end 276 of the beam 264 as compared to the free end 278 of the beam 264 in the system 260, and that there is increased strain energy produced in the rigidly mounted end 288 of the beam 282 as compared to the free end 290 of the beam 282 in the system 280. Representatively illustrated in FIGS. 26 & 27 are alternate configurations of the systems 260, 280, respectively, in which an increased thickness of the material 266 is used near the rigidly mounted end 276 of the beam 264 and near the rigidly mounted end 288 of the beam 282.

Figure 26:
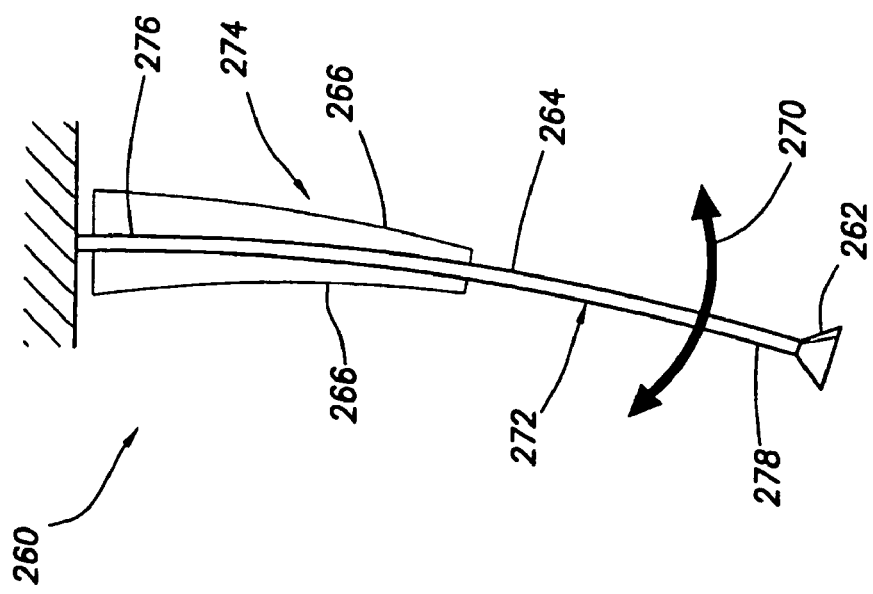
FIG. 26 is a schematic view of an alternate configuration of the fifteenth electrical power generating system.

In FIG. 26, the material 266 is provided in a single layer, and the thickness of the layer progressively increases toward the rigidly mounted end 276. In FIG. 27, the material 266 is provided in multiple layers, with the number of layers progressively increasing toward the rigidly mounted end 288. The increased material 266 thickness in each of the systems 260, 280 as depicted in FIGS. 26 & 27 allows the material to more effectively utilize the increased strain energy present at the respective rigidly mounted end 276, 288. Note that the multiple layered material 266 (as depicted in FIG. 27) could be used in the system 260, and the tapered thickness of the material (as depicted in FIG. 26) could be used in the system 280. In addition, any other means of providing increased volume of the material 266 at a region of increased strain energy may be used in keeping with the principles of the invention.

As noted above, the various electrical power generating systems described herein may be used in applications other than in subterranean wells. For example, the flow of air across a wing of an airplane could be used to generate electricity using the systems described herein. If the electrical power generated by the system is proportional, or otherwise related, to the velocity of the air, then the system may also be used as an air speed sensor for the airplane. It is to be clearly understood that the applications of the principles described herein are not limited in any manner to the specific embodiments contained in this description.

Of course, a person skilled in the art would, upon a careful consideration of the above description of representative embodiments of the invention, readily appreciate that many modifications, additions, substitutions, deletions, and other changes may be made to these specific embodiments, and such changes are contemplated by the principles of the present invention. For example, any of the electrical power generating systems described herein may include any of the generators, vibrating assemblies, elastic supports, lift reversal devices or vortex shedding devices described herein, or any combination of the generators, vibrating assemblies, elastic supports, lift reversal devices or vortex shedding devices described herein. Accordingly, the foregoing detailed description is to be clearly understood as being given by way of illustration and example only, the spirit and scope of the present invention being limited solely by the appended claims and their equivalents.

What is claimed is:

1. An electrical power generating system, comprising:
   a vibrating assembly which displaces in response to fluid flow across the vibrating assembly; and
   a generator which generates electrical power in response to displacement of the vibrating assembly,
   wherein the vibrating assembly includes a lift reversal device which produces alternating lift coefficients in the vibrating assembly in response to the fluid flow across the vibrating assembly, the lift coefficients alternating as an angle of attack of the fluid flow across the vibrating assembly increases.

2. The system according to claim 1, wherein the vibrating assembly vibrates in response to the alternating lift coefficients in the vibrating assembly.

3. The system according to claim 1, wherein the lift reversal device is generally rectangular prism-shaped.

4. The system according to claim 1, wherein the vibrating assembly further includes an elastic support for the lift reversal device, the elastic support biasing the lift reversal device toward a neutral position against lift forces produced by the fluid flow.

5. The system according to claim 1, wherein the generator includes an electromagnetically active material, and wherein strain is produced in the material in response to displacement of the vibrating assembly.

6. The system according to claim 1, wherein the generator includes a magnet and coil, and wherein relative displacement between the magnet and coil produces electricity in the coil in response to displacement of the vibrating assembly.

7. The system according to claim 6, wherein a magnetic field produces electricity in the coil in response to strain being produced in an electromagnetically active material of the generator.

8. The system according to claim 6, wherein the generator further includes at least two of the magnets, and wherein a ferromagnetic spacer positioned between the magnets concentrates magnetic fields produced by the magnets.

9. The system according to claim 6, wherein displacement of the vibrating assembly in response to the fluid flow is initiated by applying an electric potential to the coil.

10. The system according to claim 6, wherein a passage extends between opposite ends of the coil, and wherein the passage is in fluid communication with the fluid flowing across the vibrating assembly at each opposite end of the coil.

11. The system according to claim 1, wherein the generator includes a magnet which is displaced relative to a ferromagnetic core, thereby producing electricity in a coil in response to displacement of the vibrating assembly.

12. The system according to claim 1, wherein the generator includes a housing which is displaced in response to displacement of the vibrating assembly, wherein the housing contains a magnet and a coil, and wherein relative displacement between the magnet and coil produces electricity in the coil in response to displacement of the housing.

13. The system according to claim 1, wherein the generator includes first and second magnets, and a coil, wherein relative displacement between the first magnet and the coil is produced in response to displacement of the vibrating assembly, and wherein magnetic fields produced by the first and second magnets bias against relative displacement between the first and second magnets.

14. The system according to claim 1, wherein the generator includes a magnet and coil, and wherein relative rotation between the magnet and coil is produced in response to displacement of the vibrating assembly.

15. The system according to claim 1, wherein the vibrating assembly displaces in response to fluid flow in a wellbore of a subterranean well.

16. An electrical power generating system, comprising:
   a vibrating assembly which displaces in response to fluid flow across the vibrating assembly; and
   a generator which generates electrical power in response to displacement of the vibrating assembly,
   wherein the generator includes a magnet and coil, and wherein relative rotation between the magnet and coil is produced in response to displacement of the vibrating assembly,
   wherein the magnet and coil are contained within a housing, and
   wherein the housing isolates the magnet and coil from the fluid flow.

17. The system according to claim 16, wherein the housing is positioned at a center of rotation of the vibrating assembly.

18. The system according to claim 16, wherein the vibrating assembly displaces in response to fluid flow in a wellbore of a subterranean well.

19. An electrical power generating system, comprising:
   a vibrating assembly which displaces in response to fluid flow across the vibrating assembly; and
   a generator which generates electrical power in response to displacement of the vibrating assembly,
   wherein the generator includes first and second magnets, and a coil, wherein relative displacement between the first magnet and the coil is produced in response to displacement of the vibrating assembly, and wherein magnetic fields produced by the first and second magnets bias against relative displacement between the first and second magnets.

20. The system according to claim 19, wherein the first magnet and the coil are contained within a housing.

21. The system according to claim 20, wherein the housing isolates the first magnet and coil from the fluid flow.

22. The system according to claim 20, wherein the housing remains substantially rigidly mounted while the second magnet displaces in response to displacement of the vibrating assembly.

23. The system according to claim 19, wherein the vibrating assembly displaces in response to fluid flow in a wellbore of a subterranean well.

24. An electrical power generating system, comprising:
   a vibrating assembly which displaces in response to fluid flow across the vibrating assembly; and
   a generator which generates electrical power in response to displacement of the vibrating assembly, wherein the generator includes a housing which is displaced in response to displacement of the vibrating assembly, wherein the housing contains a first magnet and a coil, and wherein relative displacement between the first magnet and coil produces electricity in the coil in response to displacement of the housing.

25. The system according to claim 24, wherein the first magnet is supported relative to the coil by at least one biasing device.

26. The system according to claim 25, wherein the biasing device includes a spring.

27. The system according to claim 25, wherein the biasing device includes an elastomeric member.

28. The system according to claim 25, wherein the biasing device includes a compressed fluid.

29. The system according to claim 25, wherein the biasing device includes at least one second magnet.

30. The system according to claim 29, wherein at least one pole of the second magnet repels at least one pole of the first magnet.

31. The system according to claim 24, wherein displacement of the vibrating assembly in response to the fluid flow is initiated by applying an electric potential to the coil.

32. The system according to claim 31, wherein the application of an electric potential to the coil displaces the vibrating assembly relative to the fluid flow.

33. The system according to claim 31, wherein the application of an electric potential to the coil produces strain in an elastic support which supports the vibrating assembly.

34. The system according to claim 24, wherein the vibrating assembly displaces in response to fluid flow in a wellbore of a subterranean well.

35. An electrical power generating system, comprising:
a vibrating assembly which displaces in response to fluid flow across the vibrating assembly; and
a generator which generates electrical power in response to displacement of the vibrating assembly,
wherein the generator includes a magnet which is displaced relative to a ferromagnetic core, thereby producing electricity in a coil in response to displacement of the vibrating assembly.

36. The system according to claim 35, wherein the magnet is aligned with a longitudinal axis of the vibrating assembly.

37. The system according to claim 35, wherein the ferromagnetic core is aligned with a longitudinal axis of the vibrating assembly.

38. The system according to claim 35, wherein the coil is aligned with a longitudinal axis of the vibrating assembly.

39. The system according to claim 35, wherein the coil and ferromagnetic core remain substantially rigidly mounted while the magnet is displaced in response to displacement of the vibrating assembly.

40. The system according to claim 35, wherein the generator further includes multiple magnets which are displaced relative to respective multiple ferromagnetic cores, thereby producing electricity in respective multiple coils in response to displacement of the vibrating assembly.

41. The system according to claim 35, wherein the vibrating assembly displaces in response to fluid flow in a wellbore of a subterranean well.

42. An electrical power generating system, comprising:
a vibrating assembly which displaces in response to fluid flow across the vibrating assembly; and
a generator which generates electrical power in response to displacement of the vibrating assembly,
wherein the generator includes a magnet and coil, wherein relative displacement between the magnet and coil produces electricity in the coil in response to displacement of the vibrating assembly, and wherein displacement of the vibrating assembly in response to the fluid flow is initiated by applying an electric potential to the coil.

43. The system according to claim 42, wherein the application of the electric potential to the coil displaces the vibrating assembly relative to the fluid flow.

44. The system according to claim 42, wherein the application of the electric potential to the coil produces strain in an elastic support which supports the vibrating assembly.

45. The system according to claim 42, wherein the vibrating assembly displaces in response to fluid flow in a wellbore of a subterranean well.

46. An electrical power generating system, comprising:
a vibrating assembly which displaces in response to fluid flow across the vibrating assembly; and
a generator which generates electrical power in response to displacement of the vibrating assembly,
wherein the generator includes an electromagnetically active material, strain being produced in the electromagnetically active material in response to displacement of the vibrating assembly, and
wherein the vibrating assembly displacement is transmitted to the electromagnetically active material across a membrane isolating the material from the fluid flow.

47. An electrical power generating system, comprising:
a vibrating assembly which displaces in response to fluid flow across the vibrating assembly; and
a generator which generates electrical power in response to displacement of the vibrating assembly,
wherein the generator includes an electromagnetically active material, strain being produced in the electromagnetically active material in response to displacement of the vibrating assembly, and
wherein displacement of the vibrating assembly in response to the fluid flow is initiated by applying an electric potential to the electromagnetically active material.

48. An electrical power generating system, comprising:
a vibrating assembly which displaces in response to fluid flow across the vibrating assembly; and
a generator which generates electrical power in response to displacement of the vibrating assembly,
wherein the generator includes an electromagnetically active material, strain being produced in the electromagnetically active material in response to displacement of the vibrating assembly, and
wherein displacement of the vibrating assembly in response to the fluid flow is initiated by applying a magnetic field to the electromagnetically active material.

49. An electrical power generating system, comprising:
a vibrating assembly which displaces in response to fluid flow across the vibrating assembly in a wellbore of a subterranean well; and
a generator which generates electrical power in response to displacement of the vibrating assembly,
wherein the generator includes an electromagnetically active material, strain being produced in the electromagnetically active material in response to displacement of the vibrating assembly, and
wherein displacement of the vibrating assembly in response to the fluid flow is initiated by producing strain in the electromagnetically active material, the displacement of the vibrating assembly being initiated in response to producing strain in the electromagnetically active material.

* * * * *